(12) United States Patent
Williams et al.

(10) Patent No.: US 9,478,938 B2
(45) Date of Patent: Oct. 25, 2016

(54) THICK POLYCRYSTALLINE SYNTHETIC DIAMOND WAFERS FOR HEAT SPREADING APPLICATIONS AND MICROWAVE PLASMA CHEMICAL VAPOUR DEPOSITON SYNTHESIS TECHNIQUES

(71) Applicant: Element Six Technologies Limited, Oxfordshire (GB)

(72) Inventors: Gruffudd Trefor Williams, Oxfordshire (GB); Joseph Michael Dodson, Berkshire (GB); Paul Nicolas Inglis, Berkshire (GB); Christopher John Kelly, Oxfordshire (GB)

(73) Assignee: Element Six Technologies Limited (GB)

( * ) Notice: Subject to any disclaimer, the term of this patent is extended or adjusted under 35 U.S.C. 154(b) by 0 days.

(21) Appl. No.: 14/419,340

(22) PCT Filed: Aug. 9, 2013

(86) PCT No.: PCT/EP2013/066753
§ 371 (c)(1),
(2) Date: Feb. 3, 2015

(87) PCT Pub. No.: WO2014/026930
PCT Pub. Date: Feb. 20, 2014

(65) Prior Publication Data
US 2015/0222087 A1 Aug. 6, 2015

Related U.S. Application Data

(60) Provisional application No. 61/682,669, filed on Aug. 13, 2012.

(30) Foreign Application Priority Data
Aug. 13, 2012 (GB) .................... 1214370.7

(51) Int. Cl.
| B32B 3/00 | (2006.01) |
| H01S 5/024 | (2006.01) |
| C01B 31/06 | (2006.01) |
| C23C 16/27 | (2006.01) |
| C30B 25/10 | (2006.01) |
| C30B 29/04 | (2006.01) |
| C23C 16/511 | (2006.01) |
| C23C 16/52 | (2006.01) |
| C30B 25/16 | (2006.01) |
| C30B 25/18 | (2006.01) |

(52) U.S. Cl.
CPC ........... *H01S 5/02484* (2013.01); *C01B 31/06* (2013.01); *C23C 16/274* (2013.01); *C23C16/511* (2013.01); *C23C 16/52* (2013.01); *C30B 25/105* (2013.01); *C30B 25/16* (2013.01); *C30B 25/18* (2013.01); *C30B 29/04* (2013.01); *Y10T 428/21* (2015.01); *Y10T 428/24471* (2015.01)

(58) Field of Classification Search
CPC . C23C 14/0611; C30B 25/105; C30B 25/04; C30B 25/16; C30B 25/18; Y10T 428/21; Y10T 428/24471
See application file for complete search history.

(56) References Cited

U.S. PATENT DOCUMENTS

| 6,582,513 B1 | 6/2003 | Linares |
| 6,645,343 B1 | 11/2003 | Wild et al. |
| 2014/0342122 A1* | 11/2014 | Inglis ............... C23C 16/01 428/141 |
| 2014/0349068 A1* | 11/2014 | Inglis ............... C23C 16/01 428/141 |
| 2015/0110987 A1* | 4/2015 | Liggins ............ C23C 16/274 428/64.1 |

FOREIGN PATENT DOCUMENTS

| GB | 2486784 A | 6/2012 |
| JP | 0492896 A | 3/1992 |
| JP | 0497988 A | 3/1992 |
| JP | 2006248883 A | 9/2006 |
| WO | 01/96633 A1 | 12/2001 |
| WO | 2010/010352 A1 | 1/2010 |
| WO | 2013/087797 A1 | 6/2013 |

OTHER PUBLICATIONS

Search Report for GB1214370.7 dated Dec. 12, 2012.
Search Report for GB1314319.3 dated Jan. 27, 2014.
International Search Report for PCT/EP2013/066753 dated Oct. 21, 2013.
Coe, et al., "Optical, thermal and mechanical properties of CVD diamond", Diamond and Related Materials, Elsevier Science Publishers, vol. 9, No. 9-10, p. 1726.
Burgemeister et al., "Thermal conductivity of natural diamond between 320 and 450 K", Physica B + C, North-Holland Amsterdam, vol. 93, No. 2, pp. 165-179.
Balmer et al., "Chemical vapour deposition synthetic diamond: materials, technology and application", J. Phys. Condensed Matter, vol. 21, No. 36, 2009.
Silva et al., "Microwave engineering of plasma-assisted CVD reactors for diamond deposition", J. Phys. Condens. Matter, vol. 21, No. 36, 2009.
Twitchen et al., "Thermal conductivity measurements on CVD diamond" Diamond and Related Materials, 10 (2001) pp. 731-735.

\* cited by examiner

*Primary Examiner* — Elizabeth Mulvaney
(74) *Attorney, Agent, or Firm* — Bryan Cave LLP

(57) ABSTRACT

A method of fabricating a polycrystalline CVD synthetic diamond material having an average thermal conductivity at room temperature through a thickness of the polycrystalline CVD synthetic diamond material of at least 2000 $Wm^{-1}K^{-1}$, the method comprising: loading a refractory metal substrate into a CVD reactor; locating a refractory metal guard ring around a peripheral region of the refractory metal substrate, the refractory metal guard ring defining a gap between an edge of the refractory metal substrate and the refractory metal guard ring having a width 1.5 mm to 5.0 mm; introducing microwaves into the CVD reactor at a power such that the power density in terms of power per unit area of the refractory metal substrate is in a range 2.5 to 4.5 W $mm^{-2}$; introducing process gas into the CVD reactor wherein the process gas within the CVD reactor comprises a nitrogen concentration in a range 600 ppb to 1500 ppb calculated as molecular nitrogen N2, a carbon containing gas concentration in a range 0.5% to 3.0% by volume, and a hydrogen concentration in a range 92% to 98.5% by volume; controlling an average temperature of the refractory metal substrate to lie in a range 750° C. to 950° C. and to maintain a temperature difference between an edge and a centre point on the refractory metal substrate of no more than 80° C. growing polycrystalline CVD synthetic diamond material to a thickness of at least 1.3 mm on the refractory metal substrate; and cooling the polycrystalline CVD synthetic diamond material to yield a polycrystalline CVD synthetic diamond material having a thickness of at least 1.3 mm, an average thermal conductivity at room temperature through the thickness of the polycrystalline CVD synthetic diamond material of at least 2000 $Wm^{-1}K^{-1}$ over at least a central area of the polycrystalline CVD synthetic diamond material, wherein the central area is at least 70% of a total area of the polycrystalline CVD synthetic diamond material, a single substitutional nitrogen concentration no more than 0.80 ppm over at least the central area of the polycrystalline CVD synthetic diamond material, and wherein the polycrystalline CVD synthetic diamond material is substantially crack free over at least the central area thereof such that the central area has no cracks which intersect both external major faces of the polycrystalline CVD synthetic diamond material and extend greater than 2 mm in length.

18 Claims, 8 Drawing Sheets

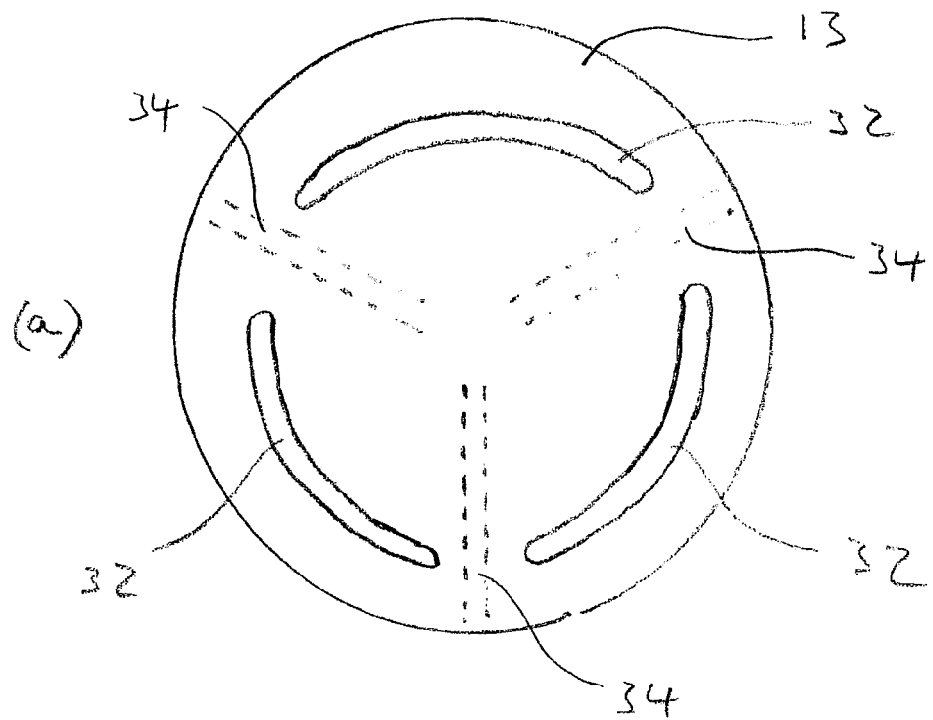
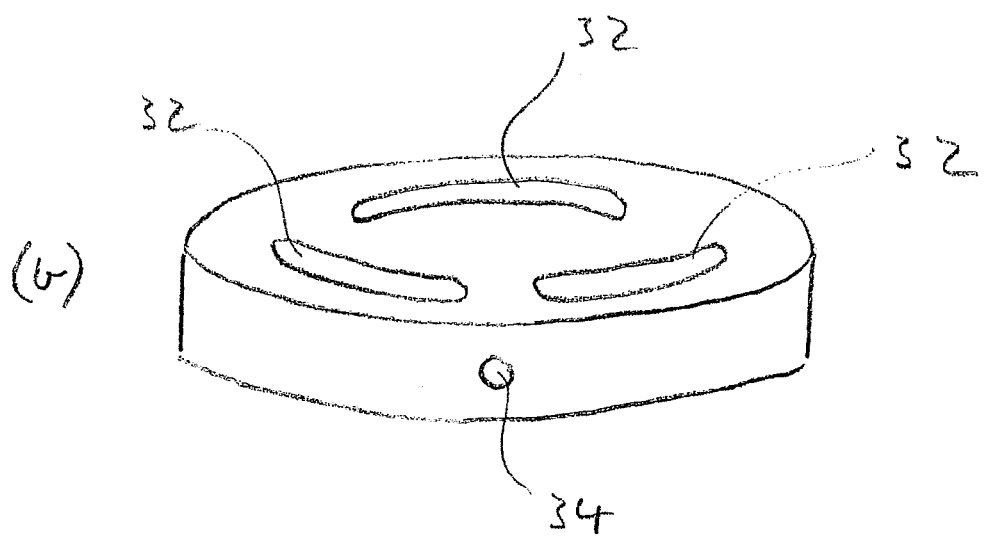
Fig 3

Fig 5
(a)
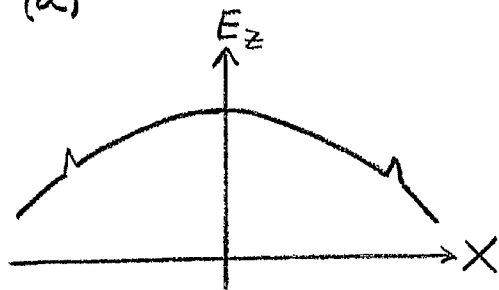
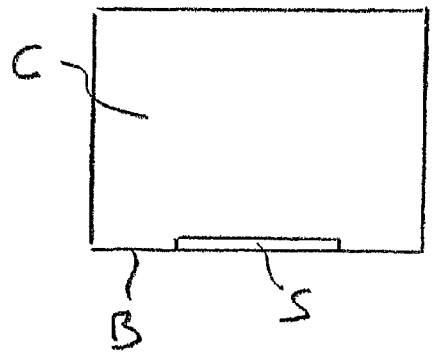
(b)
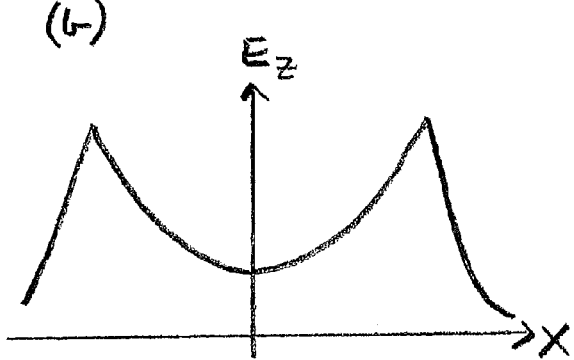
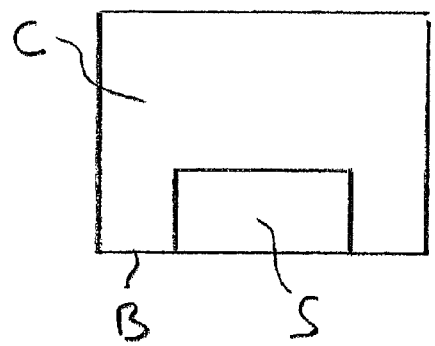
(c)
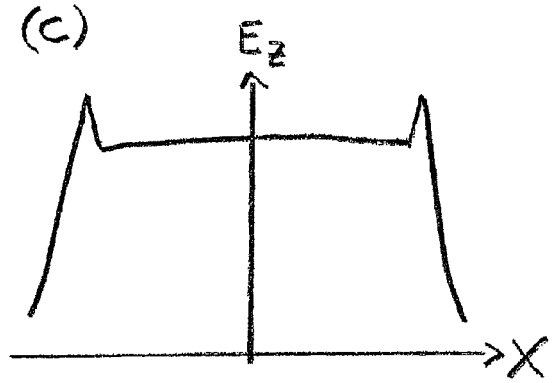
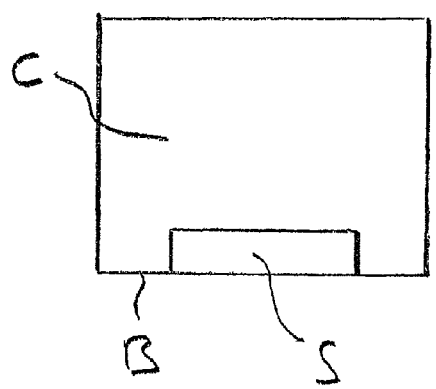

Fig 6
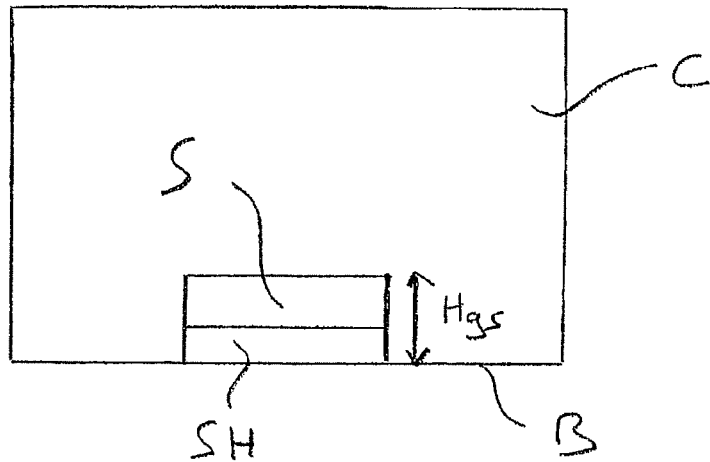
(a)
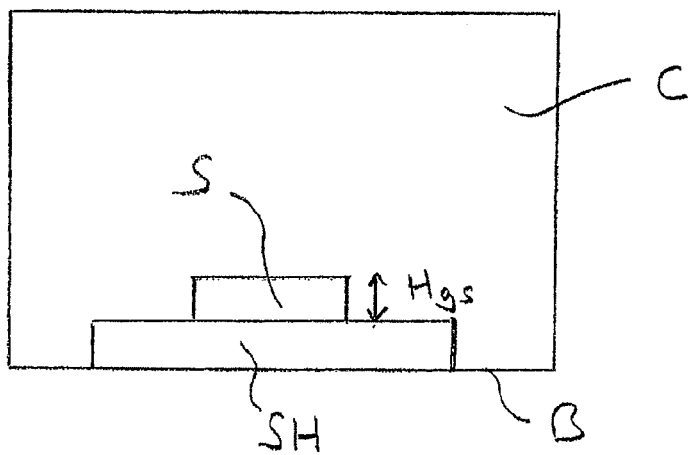
(b)
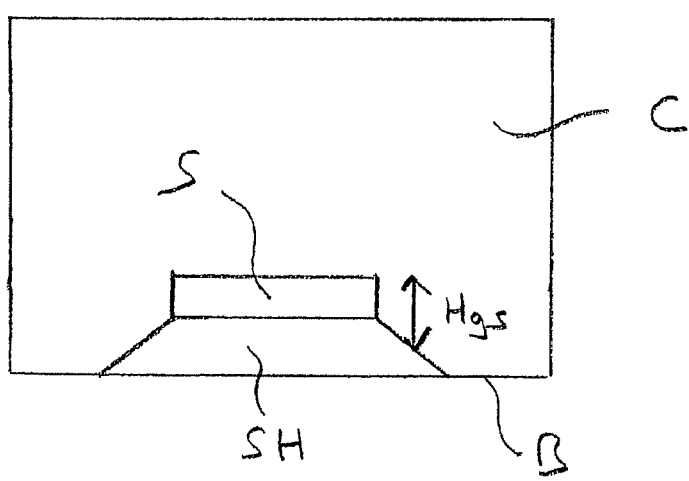
(c)

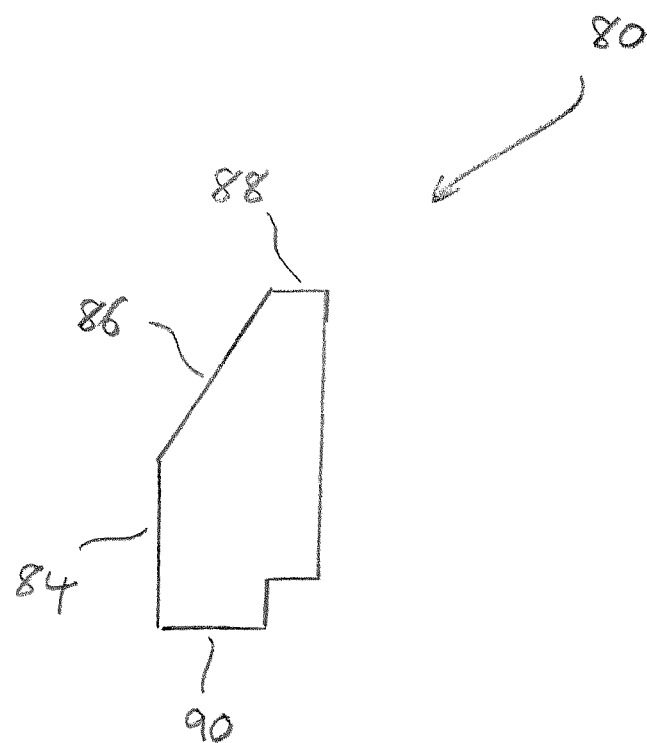

THICK POLYCRYSTALLINE SYNTHETIC DIAMOND WAFERS FOR HEAT SPREADING APPLICATIONS AND MICROWAVE PLASMA CHEMICAL VAPOUR DEPOSITON SYNTHESIS TECHNIQUES

FIELD OF THE INVENTION

The present invention relates to the fabrication of thick polycrystalline synthetic diamond wafers for heat spreading applications using a chemical vapour deposition (CVD) technique.

BACKGROUND OF INVENTION

Chemical vapour deposition (CVD) processes for synthesis of diamond material are now well known in the art. Useful background information relating to the chemical vapour deposition of diamond materials may be found in a special issue of the Journal of Physics: Condensed Matter, Vol. 21, No. 36 (2009) which is dedicated to diamond related technology. For example, the review article by R. S. Balmer et al. gives a comprehensive overview of CVD diamond materials, technology and applications (see "Chemical vapour deposition synthetic diamond: materials, technology and applications" J. Phys.: Condensed Matter, Vol. 21, No. 36 (2009) 364221).

Being in the region where diamond is metastable compared to graphite, synthesis of diamond under CVD conditions is driven by surface kinetics and not bulk thermodynamics. Diamond synthesis by CVD is normally performed using a small fraction of carbon (typically <5%), typically in the form of methane although other carbon containing gases may be utilized, in an excess of molecular hydrogen. If molecular hydrogen is heated to temperatures in excess of 2000 K, there is a significant dissociation to atomic hydrogen. In the presence of a suitable substrate material, synthetic diamond material can be deposited.

Atomic hydrogen is essential to the process because it selectively etches off non-diamond carbon from the substrate such that diamond growth can occur. Various methods are available for heating carbon containing gas species and molecular hydrogen in order to generate the reactive carbon containing radicals and atomic hydrogen required for CVD diamond growth including arc-jet, hot filament, DC arc, oxy-acetylene flame, and microwave plasma.

Methods that involve electrodes, such as DC arc plasmas, can have disadvantages due to electrode erosion and incorporation of material into the diamond. Combustion methods avoid the electrode erosion problem but are reliant on relatively expensive feed gases that must be purified to levels consistent with high quality diamond growth. Also the temperature of the flame, even when combusting oxy-acetylene mixes, is insufficient to achieve a substantial fraction of atomic hydrogen in the gas stream and the methods rely on concentrating the flux of gas in a localized area to achieve reasonable growth rates. Perhaps the principal reason why combustion is not widely used for bulk diamond growth is the cost in terms of kWh of energy that can be extracted. Compared to electricity, high purity acetylene and oxygen are an expensive way to generate heat. Hot filament reactors while appearing superficially simple have the disadvantage of being restricted to use at lower gas pressures which are required to ensure relatively effective transport of their limited quantities of atomic hydrogen to a growth surface.

In light of the above, it has been found that microwave plasma is the most effective method for driving CVD diamond deposition in terms of the combination of power efficiency, growth rate, growth area, and purity of product which is obtainable.

A microwave plasma activated CVD diamond synthesis system typically comprises a plasma reactor vessel coupled both to a supply of source gases and to a microwave power source. The plasma reactor vessel is configured to form a resonance cavity supporting a standing microwave. Source gases including a carbon source and molecular hydrogen are fed into the plasma reactor vessel and can be activated by the standing microwave to form a plasma in high field regions. If a suitable substrate is provided in close proximity to the plasma, reactive carbon containing radicals can diffuse from the plasma to the substrate and be deposited thereon. Atomic hydrogen can also diffuse from the plasma to the substrate and selectively etch off non-diamond carbon from the substrate such that diamond growth can occur.

A range of possible microwave plasma reactors for synthetic diamond film growth using a CVD process are known in the art. Such reactors have a variety of different designs. Common features include: a plasma chamber; a substrate holder disposed in the plasma chamber; a microwave generator for forming the plasma; a coupling configuration for feeding microwaves from the microwave generator into the plasma chamber; a gas flow system for feeding process gases into the plasma chamber and removing them therefrom; and a temperature control system for controlling the temperature of a substrate on the substrate holder.

A useful overview article by Silva et al. summarizing various possible reactor designs is given in the previous mentioned Journal of Physics (see "Microwave engineering of plasma-assisted CVD reactors for diamond deposition" J. Phys.: Condens. Matter, Vol. 21, No. 36 (2009) 364202). Having regard to the patent literature, U.S. Pat. No. 6,645,343 (Fraunhofer) discloses an example of a microwave plasma reactor configured for diamond film growth via a chemical vapour deposition process. The reactor described therein comprises a cylindrical plasma chamber with a substrate holder mounted on a base thereof. A cooling device is provided below the substrate holder for controlling the temperature of a substrate on the substrate holder. Furthermore, a gas inlet and a gas outlet are provided in the base of the plasma chamber for supplying and removing process gases. A microwave generator is coupled to the plasma chamber via a high-frequency coaxial line which is subdivided at its delivery end above the plasma chamber and directed at the periphery of the plasma chamber to an essentially ring-shaped microwave window in the form of a quartz ring mounted in a side wall of the plasma chamber.

Using microwave plasma reactors such as those disclosed in the prior art it is possible to grow polycrystalline diamond wafers by chemical vapour deposition on a suitable substrate such as a silicon wafer or a carbide forming refractory metal disk. Such polycrystalline CVD diamond wafers are generally opaque in their as-grown form but can be made transparent by polishing opposing faces of the wafers to produce transparent polycrystalline diamond windows for optical applications.

Diamond material is useful as a heat spreading component as it has a high thermal conductivity. For example, one such application is as a heat spreading substrate in a disk laser as illustrated schematically in FIG. 1. A disk laser comprises a heat spreading substrate S on which a thin disk of laser gain material LGM is disposed. The thin disk is also often called an active mirror because it acts as a mirror with laser gain.

The heat spreading substrate may be subjected to a coolant C for extracting and removing heat therefrom. An output coupler O is positioned opposite the active mirror to form an optical cavity OC. The active mirror is pumped with, for example, a diode laser DL and high powered laser light LL is emitted through the output coupler.

It is known to use a polycrystalline CVD synthetic diamond wafer as a heat spreading substrate for mounting the active mirror of a disk laser. Diamond material has been found to be useful in such an application because of its extremely high thermal conductivity. Furthermore, diamond material has a very low thermal expansion coefficient such that thermal distortion is low.

The thermal performance of a polycrystalline CVD synthetic diamond wafer is dependent on the physical dimensions of the wafer (diameter and thickness) and the quality of the diamond material forming the wafer. For example, a thick, large area wafer will tend to have better heat spreading functionality than a thin, small area wafer. Furthermore, it is known that thermal conductivity is affected by grain size, impurities and/or defects such as non-diamond carbon which are incorporated into the diamond material during growth. In addition, material quality is intimately linked with wafer geometry and growth rate. For example, growing wafers to increased thickness tends to increase the rate at which impurities and/or defects are incorporated into a polycrystalline CVD synthetic diamond wafer. Furthermore, growing wafers to increased diameter tends to increase the rate at which impurities and/or defects are incorporated into a polycrystalline CVD synthetic diamond wafer, particularly at a periphery of the wafers. Further still, growing wafers at increased growth rate tends to increase the rate at which impurities and/or defects are incorporated into a polycrystalline CVD synthetic diamond wafer. In addition, growing wafers to increased thickness, diameter, and/or growth rate can also lead to problems of wafer cracking during the synthesis process.

For applications such as high performance disk lasers, it is desirable to provide polycrystalline CVD synthetic diamond wafers having a diameter of 20 mm, a thickness of at least 2 mm, and a thermal conductivity of at least 2000 $Wm^{-1}K^{-1}$. Typical thermal-grades of polycrystalline CVD synthetic diamond wafers tend to have a thermal conductivity of less than 2000 $Wm^{-1}K^{-1}$. Accordingly, for such high performance thermal applications, to date higher quality dielectric-grade or optical-grade polycrystalline CVD synthetic diamond wafers have been utilized. However, such higher grades of polycrystalline CVD synthetic diamond material are generally grown at lower growth rates in order to achieve better quality material leading to increased expense.

In light of the above, it is an aim of certain embodiments of the present invention to provide a lower cost microwave plasma CVD diamond synthesis process in order to fabricate thick polycrystalline CVD synthetic diamond wafers having high thermal conductivity for heat spreading applications such as in disk lasers.

SUMMARY OF INVENTION

One approach to solve the aforementioned problem would be to develop a new larger area polycrystalline CVD synthetic diamond wafer growth process such that more material is produced per growth run. Such larger area as-grown wafers could then be cut into a number of smaller product wafers such that a plurality of product wafers are produced by each growth run thus reducing cost per product wafer. However, as previously discussed it can be problematic to grow polycrystalline CVD synthetic diamond wafers to larger areas without a significant reduction in the quality and thermal performance of the material around peripheral regions. This can be partially compensated by reducing the growth rate but this negates any economic benefit from growing larger areas of material in a single growth run by increasing the time and associated expense of each individual growth run.

An alternative to solve the aforementioned problem would be to develop a new higher growth rate synthesis process without unduly reducing the area of the material grown per run in order to reduce time and associated cost per growth run. This has been identified as being the more feasible route to an improved economic process for producing high performance, thick, large area thermal grade polycrystalline CVD diamond wafer material. However, achieving a successful technical solution using this route has proved difficult.

Increasing the growth rate of current high thermal grade material can be achieved by modifying the process gas composition to have an increased concentration of methane and an increased concentration of nitrogen. However, this results in reduced quality of material and an associated reduction in thermal conductivity. This problem can be compensated by increasing the power density within the plasma chamber during the growth process to "clean-up" the material during growth. Increasing power density can be achieved by either increasing the power input to the plasma chamber or otherwise reducing the substrate area thereby increasing the power density expressed in terms of the power per unit area of substrate. However, a further problem occurs when such a modification is made in that an increased power density leads to an increase in temperature variation between an edge region and a central region of the substrate at increased power densities with higher temperatures at edge regions leading to tensile stress in the edge regions causing cracking In order to solve this problem, a suitably modified refractory metal guard ring has been provided to cool the edge regions, achieving a more uniform temperature across the substrate at high power densities and resulting in crack free, high growth rate, high thermal grade material.

According to a first aspect of the present invention there is provided a method of fabricating a polycrystalline CVD synthetic diamond material having an average thermal conductivity at room temperature through a thickness of the polycrystalline CVD synthetic diamond material of at least 2000 $Wm^{-1}K^{-1}$, the method comprising:

loading a refractory metal substrate into a CVD reactor;
locating a refractory metal guard ring around a peripheral region of the refractory metal substrate, the refractory metal guard ring defining a gap between an edge of the refractory metal substrate and the refractory metal guard ring having a width 1.5 mm to 5.0 mm;
introducing microwaves into the CVD reactor at a power such that the power density in terms of power per unit area of the refractory metal substrate is in a range 2.5 to 4.5 W $mm^{-2}$;
introducing process gas into the CVD reactor wherein the process gas within the CVD reactor comprises a nitrogen concentration, calculated as molecular nitrogen $N_2$, in a range 600 ppb to 1500 ppb, a carbon containing gas concentration in a range 1.5% to 3.0% by volume, and a hydrogen concentration in a range 92% to 98.5% by volume;
controlling an average temperature of the refractory metal substrate to lie in a range 750° C. to 950° C. and to maintain a temperature difference between an edge and a centre point on the refractory metal substrate of no more than 80° C.

growing polycrystalline CVD synthetic diamond material to a thickness of at least 1.3 mm on the refractory metal substrate; and cooling the polycrystalline CVD synthetic diamond material to yield a polycrystalline CVD synthetic diamond material having a thickness of at least 1.3 mm, an average thermal conductivity at room temperature through a thickness of the polycrystalline CVD synthetic diamond material of at least 2000 $Wm^{-1}K^{-1}$ over at least a central area of the polycrystalline CVD synthetic diamond material, wherein the central area is at least 70% of a total area of the polycrystalline CVD synthetic diamond material, a single substitutional nitrogen concentration no more than 0.80 ppm over at least the central area of the polycrystalline CVD synthetic diamond material, and wherein the polycrystalline CVD synthetic diamond material is substantially crack free over at least the central area thereof such that the central area has no cracks which intersect both external major faces of the polycrystalline CVD synthetic diamond material and extend greater than 2 mm in length.

According to a second aspect of the present invention there is provided a polycrystalline CVD synthetic diamond material comprising:

an average thermal conductivity at room temperature through a thickness of the polycrystalline CVD synthetic diamond material of at least 2000 $Wm^{-1}K^{-1}$ over at least a central area of the polycrystalline CVD synthetic diamond material, wherein the central area is at least 70% of a total area of the polycrystalline CVD synthetic diamond material; and a single substitutional nitrogen concentration no more than 0.80 ppm over at least the central area of the polycrystalline CVD synthetic diamond material;

wherein the thickness of the polycrystalline CVD synthetic diamond material is at least 1.3 mm; and wherein the polycrystalline CVD synthetic diamond material is substantially crack free over at least the central area such that the central area has no cracks which intersect both external major faces of the polycrystalline CVD synthetic diamond material and extend greater than 2 mm in length.

With respect to the first aspect of the invention, the growth rate of the material has been increased when compared with previous dielectric grade and optical grade polycrystalline CVD synthetic diamond synthesis process by increasing the concentration of nitrogen and carbon containing gas within the CVD synthesis atmosphere. This would usually lead to an increase in the concentration of non-diamond carbon within the product material leading to a decrease in the thermal conductivity of the product material. However, this has been counteracted by increasing the power density which may be achieved by maintaining the total microwave power input to the CVD reactor chamber but decreasing the refractory metal substrate diameter. The increase in power density decreases the net rate of non-diamond carbon formation. With respect to the second aspect of the invention, and rather counter-intuitively, the modified process conditions also lead to a product containing less single substitutional nitrogen even though a higher nitrogen concentration is provided in the gas phase to increase growth rate. Again, the decrease in nitrogen uptake is due to the increase in power density when compared with previous growth processes used for large area dielectric and optical grade polycrystalline CVD synthetic diamond material. The product characteristics are thus characteristic of a higher power density process which allows the growth of thicker wafers at higher growth rates without detrimentally affecting the thermal properties of the product wafer.

The present inventors have thus developed a cheaper synthesis route to thick polycrystalline CVD synthetic diamond material with good thermal characteristics and a new product material which has characteristics indicative of the cheaper synthesis process.

BRIEF DESCRIPTION OF THE DRAWINGS

For a better understanding of the present invention and to show how the same may be carried into effect, embodiments of the present invention will now be described by way of example only with reference to the accompanying drawings, in which:

FIGS. 3(a), 3(b) and FIG. 4 illustrate components of a microwave coupling configuration for coupling microwaves into a plasma chamber;

FIGS. 5(a) to 5(c) show electric field profile plots for varying heights of substrate within a microwave plasma reactor;

FIGS. 6(a) to 6(c) show how the height of the growth surface of the substrate is calculated relative to a mean height of a surface surrounding the substrate;

FIG. 8 illustrates a cross-sectional view of a refractory metal guard ring.

DETAILED DESCRIPTION

Figure 1:
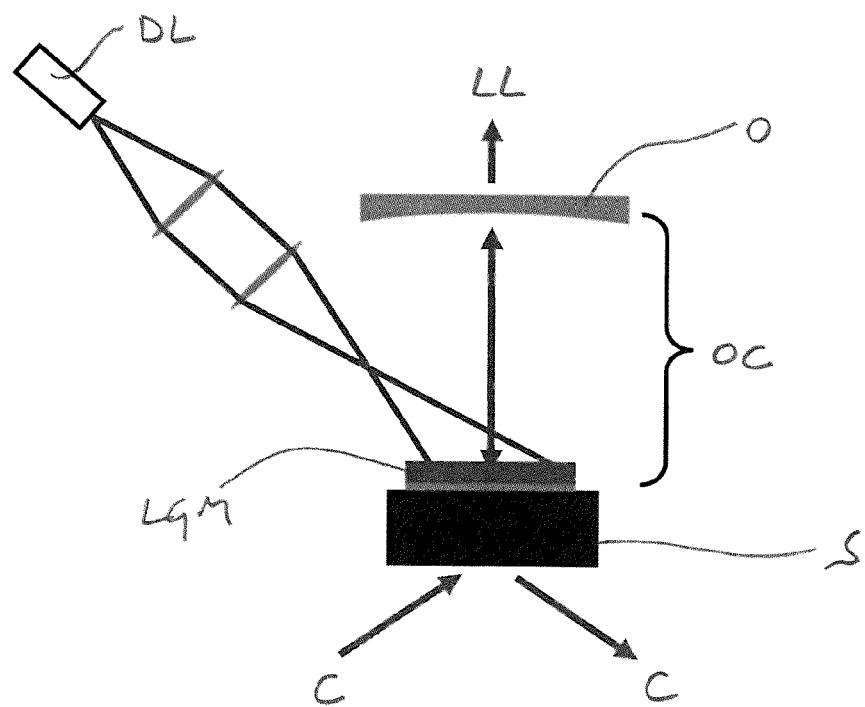
FIG. 1 illustrates a disk laser comprising a diamond heat spreading substrate.
Figure 2:
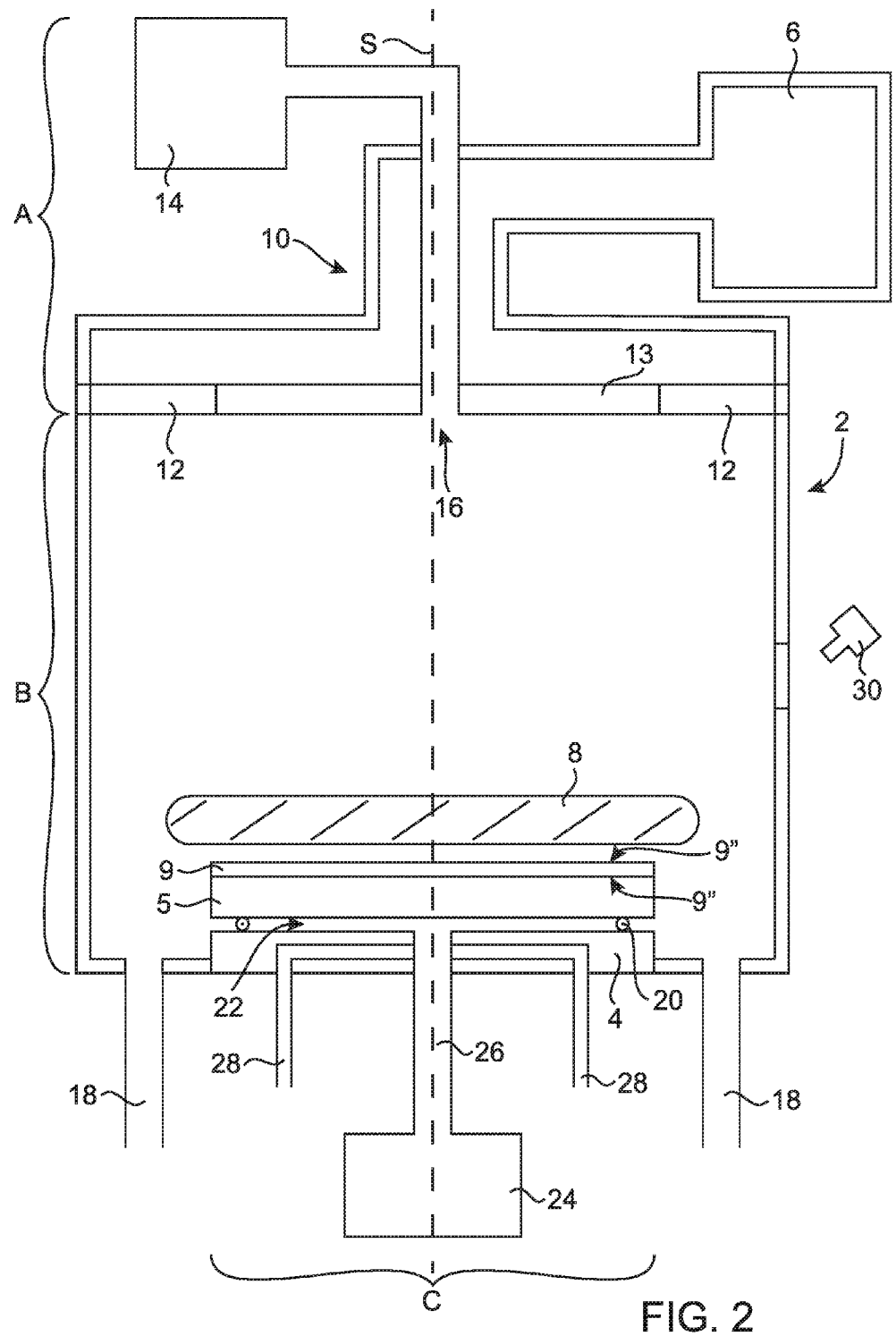
FIG. 2 illustrates a microwave plasma reactor configured to fabricate thick, high thermal conductivity polycrystalline CVD diamond wafers.

The microwave plasma reactor illustrated in FIG. 2 comprises the following components: a plasma chamber 2; a substrate holder 4; a substrate 5; a microwave generator 6; plasma 8 generated in use for growing a polycrystalline CVD diamond wafer 9 having a nucleation face 9' and a growth face 9"; a microwave coupling configuration 10; dielectric window 12; source gas container system 14; one or more gas inlets 16; one or more gas outlets 18; spacer wires or spacer pads 20 to define a gas gap 22 between a supporting surface of the substrate holder 4 and a rear surface of the substrate 5; and a substrate temperature control arrangement comprising a gas supply system 24 coupled to the gas gap 22 via a supply pipe 26, and a coolant liquid supply system 28 for cooling the substrate holder.

The microwave plasma reactor can be considered to comprise three subsystems: (A) gas and microwave delivery systems configured to deliver process gases and microwaves into a plasma chamber through a top plate of the plasma chamber; (B) a plasma chamber comprising a base, a top plate, and a side wall extending from the base to the top plate defining a resonance cavity for supporting a microwave resonance mode, the resonance cavity comprising a central rotational axis of symmetry S extending from the base to the top plate; and (C) a substrate mounting configuration comprising a substrate holder disposed in the base of the plasma chamber providing a supporting surface for supporting a substrate on which the polycrystalline CVD diamond wafer can be grown in use and a substrate temperature control system comprising a coolant delivery system for supplying liquid and/or gas coolant to the substrate holder to control a temperature profile across the supporting surface of the substrate holder in use.

Each of the subsystems will be described in more detail below.

(A) The Gas and Microwave Delivery System

The microwave coupling configuration 10 comprises a coaxial waveguide configured to feed microwaves from a rectangular waveguide to an annular dielectric window 12. The coaxial waveguide comprises an inner conductor and an outer conductor. The annular dielectric window is made of a microwave permeable material such as quartz which forms a vacuum-tight window in a top portion of the plasma chamber. The microwave generator 6 and the microwave coupling configuration 10 are configured to generate a suitable wavelength of microwaves and inductively couple the microwaves into the plasma chamber to form a standing wave within the plasma chamber having a high energy anti-node located just above the substrate 5 in use.

The microwave coupling configuration 10 further comprises a waveguide plate 13. The waveguide plate 13 and its mounting configuration are illustrated in more detail in FIGS. 3(a), 3(b), and 4. The waveguide plate 13 comprising a plurality of apertures 32 disposed in an annular configuration, each aperture forming a waveguide for coupling microwaves from the coaxial waveguide into the plasma chamber through the annular dielectric window 12. The waveguide plate may also comprise a plurality of channels 34 extending between the apertures suitable for supplying coolant and/or process gas from an outer circumferential region to an inner axial region.

This configuration has been found to be advantageous as it allows microwave power to be coupled into the plasma chamber via an annular dielectric window while also allowing of the provision of coolant and/or process gases to regions of the plasma chamber enclosed by the waveguide structure.

In addition to the above, the waveguide plate can be configured to support the central conductor of the coaxial waveguide. Accordingly, while the central conductor illustrated in FIG. 2 is a grounded post, in one alternative arrangement the central conductor can be formed as an electrically floating post which is not required to be grounded on an upper wall of the rectangular waveguide from the microwave generator. An inner conductor which is electrically floating in the waveguide is in many respects a simpler and more convenient method of transferring power from a rectangular to a coaxial waveguide. This has the disadvantage of losing the grounded point at which services such as coolant water and process gas can be introduced through the central conductor as shown in FIG. 2. However, certain embodiments of the present invention provide an alternative route for supplying such services via channels in the waveguide plate.

Furthermore, the waveguide plate can be configured to couple together upper and lower portions of the plasma chamber and avoid large compressive stresses on the annular dielectric window in use without the use of a mechanical anchor point through a central conductor of the coaxial waveguide. Further still, the annular dielectric window may comprise two opposing surfaces through which microwaves are coupled into the plasma chamber and seals may be provided on said two opposing surfaces. This allows for a reliable seal to be formed between upper and lower portions of the plasma chamber and at the dielectric window.

Figure 4:
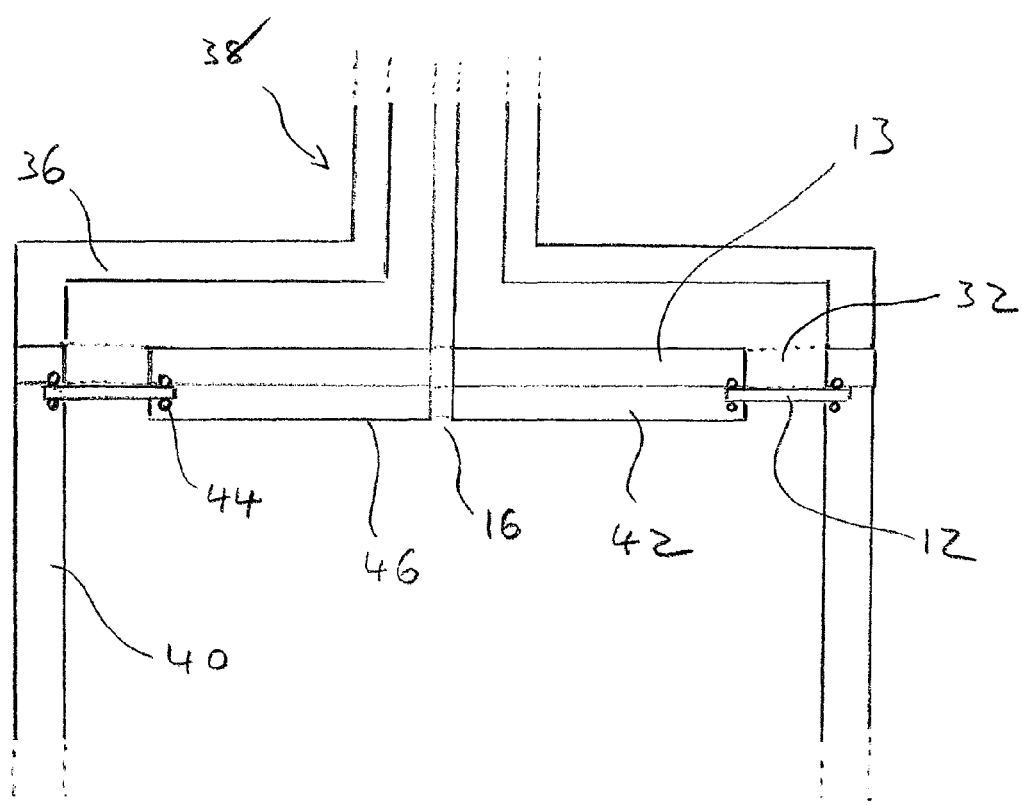

FIG. 4 shows a cross-sectional view of a portion of the microwave plasma reactor illustrating an example of how the annular dielectric window 12 and waveguide plate 13 can be mounted in the reactor. In the illustrated arrangement, an outer peripheral portion of the waveguide plate 13 is disposed between the outer conductor 36 of the coaxial waveguide 38 and a side wall 40 of the plasma chamber. An outer peripheral portion of the annular dielectric window 12 is disposed between the waveguide plate 13 and the side wall 40 of the plasma chamber. An inner portion of the annular dielectric window 12 is held between an inner portion of the waveguide plate 13 and a further plate 42. The apertures 32 in the waveguide plate are aligned with the annular dielectric window 12 and channels 34 for supplying coolant and/or process gas pass between the apertures into the inner portion of the waveguide plate 13. The annular dielectric window 12 may be mounted to the waveguide plate using elastomer o-rings 44. In this arrangement the further plate 42 can be attached to the waveguide plate 13 with a portion of the dielectric window 12 disposed and held therebetween via elastomeric o-rings 44.

The waveguide plate as described above fulfils several advantageous functions:
 (i) it allows injection of coolant and/or process gases;
 (ii) it supports the central coaxial conductor;
 (iii) it forms a coupling between the upper and lower parts of the plasma chamber;
 (iv) it feeds microwaves from the coaxial waveguide into the plasma chamber in an axial direction towards the substrate; and
 (v) it supports an annular dielectric window.

In the illustrated embodiment, the plurality of apertures in the waveguide plate are configured to couple microwaves into the plasma chamber in a direction parallel to a central axis of the plasma chamber. In this arrangement, the waveguide plate is disposed in a plane perpendicular to a central axis of the plasma chamber and forms a portion of an upper wall in the plasma chamber. It has been found that coupling microwaves into the plasma chamber in a direction parallel to the axis of the chamber is more efficient and avoids the need for a more complex coaxial feed configuration. As such, even if channels for coolant and/or process gas are not provided in the waveguide plate, and/or no floating post is provided, the waveguide plate according to the present invention is still advantageous for coupling microwaves into the plasma chamber in an efficient and simple manner.

The plurality of apertures are preferably configured to have a periodic rotational symmetry. For example, if n apertures are provided, the apertures are configured symmetrically around a circle to have n fold rotational symmetry. A symmetric arrangement is preferred to avoid asymmetries in the electric field within the plasma chamber formed as a result of asymmetries in the apertures.

The annular dielectric window as previously described is formed of a single complete ring of dielectric material. However, in an alterative arrangement the annular dielectric window may be formed of a plurality of separate arcuate segments, each segment sealed across a corresponding aperture of the waveguide plate.

In one configuration the one or more channels extending between the apertures in the waveguide plate comprise at least one channel configured to supply process gas to one or more injection ports arranged opposite the substrate holder for injecting process gas towards the substrate holder. This configuration allows an axial gas flow arrangement to be disposed at the same end of the chamber as the microwave coupling configuration.

A central portion of the waveguide plate can support a conductive surface 46 disposed opposite the substrate holder. The conductive surface may be formed by the waveguide plate or may be formed by a separate metallic body which is connected to a central portion of the waveguide plate. One or more gas inlet nozzles 16 may be disposed in the conductive surface for injecting process gas towards the substrate holder. In one configuration, the conductive surface is curved and extends towards a central region of the plasma chamber. For example, the conductive surface may form a cone-shaped body. Such a conductive surface is useful as it can aid in preventing plasma formation in an upper region of the plasma chamber. Effectively, the conductive surface can mask off a high electric field region in use. That is, the conductive surface can be located to enclose a high electric field anti-node region which would exist in a corresponding chamber which did not comprise the conductive surface extending towards a central region of the plasma chamber.

The waveguide plate may include 2, 3, 4, 5, 6, 7 or more apertures. It has been found that varying the number of apertures can affect the efficiency at which microwaves are coupled into the plasma chamber. According to certain arrangements, the waveguide plate comprises an odd number of apertures, most preferably a prime number of apertures. For example, the waveguide plate may comprise 3, 5, or 7 apertures.

Each aperture is in effect equivalent to a rectangular waveguide. A three way aperture can help to maximize the length of the aperture. Four and six way alternatives have both been found to be deficient from the point of view of mode stability. Despite the presence of several apertures, the power can be predominantly coupled into the cavity in a $TM_{0mm}$ mode. There are effects from the symmetry of the apertures visible in the form of the generation of high order modes i.e. $TM_{1mm}$ (where 1 does not equal zero). Thus a three way aperture in which all three apertures are excited in phase will couple to the $TM_{3mm}$ series of modes while the four and six way apertures might be expected to couple with the much higher order $TM_{8mm}$ and $TM_{12mm}$ modes. In practice however, the four and six way apertures are prone to parasitic modes. Thus a four or six way aperture can couple into the $TM_{2mm}$ modes. Overall the effect is that the four and six way apertures can produce asymmetries in the plasma that result in either the plasma moving off centre or splitting two ways. The three way aperture gives a stable three way pulling effect that is less undesirable than the more serious one way and two way break-up modes that occur with other configurations. Instabilities can be dealt with using mode cancelling blocks which are basically metal bodies that produce a perturbation to the local electric field that is intended to cancel that of the three way mode produced by the apertures. The position of these metal blocks can be established empirically. By placing them in regions of high wall current (i.e. where the H field is high) the blocks can be used to disrupt the unwanted mode. As such in one arrangement a plurality of mode cancelling blocks are disposed on an inner wall of the plasma chamber, for example on a side wall or on a base of the chamber, the mode cancelling blocks being configured to compensate for electromagnetic perturbations caused by the plurality of apertures. The mode cancelling blocks are spaced apart so as to be symmetrically related to the aperture configuration. For example, the number of mode cancelling blocks may be equal to the number of apertures provided in the waveguide plate, the mode cancelling blocks being positioned to have a symmetry which corresponds to the aperture arrangement. For example, if three apertures are provided in the waveguide plate then three mode cancelling blocks may be mounted around the plasma chamber wall in a lower portion of the plasma chamber and arranged symmetrically so as to cancel perturbations in the electric field caused by the apertures. Alternatively, the number of mode cancelling blocks may be an integer multiple of the number of apertures while still being arranged to be symmetrically related to the aperture configuration. The mode cancelling blocks can be adhered to an inner wall of the plasma chamber or may be integrally formed by a wall of the plasma chamber. Another possible alternative to the three way aperture is to use a five or seven way aperture. Because these are prime numbers they are resistant to over-moding with lower order two way modes etc. In this case the mode cancelling blocks may not be required.

It is further advantageous to supply microwave energy to a plasma chamber via apertures having a specific radial width. A ratio of the annular gap (in a radial direction) provided by the apertures in the waveguide plate to that of a diameter of the plasma chamber may be in the range $\frac{1}{10}$ to $\frac{1}{50}$, $\frac{1}{20}$ to $\frac{1}{40}$, $\frac{1}{25}$ to $\frac{1}{35}$, or optionally approximately $\frac{1}{30}$. This annular gap may be provided by locating the apertures adjacent the side wall of the plasma chamber with the outer conductor of the coaxial waveguide being comparable in diameter to the diameter of the resonance cavity of the plasma chamber and the inner conductor being only slightly smaller than the outer conductor to achieve a ratio as previously specified for the annular gap. By varying the ratio of the diameters of these two conductors it is possible to find an optimum point at which a match to the chamber is achieved. In an alternative arrangement, the apertures may be placed away from the side walls of the plasma chamber, e.g. at an intermediate position between the centre and an edge of the top plate. Advantageously, the components of the chamber and microwave coupling assembly should be configured to a high degree of precision, e.g. such that dimensions and positioning of components is within 0.1% of the prescribed specification.

The gas supply system comprises a source gas container system 14, one or more gas inlets 16 and one or more gas outlets 18. One axially disposed gas inlet is illustrated in FIG. 2 in the centre of the top plate of the plasma chamber which also forms the previously described waveguide plate 13. Optionally, the gas inlet can be modified to provide an array of gas inlet nozzles across an area of the top plate of the plasma chamber.

The gas inlet is positioned in a top portion of the plasma chamber directly above the substrate holder and configured to directly feed gas at high velocity towards the substrate. Process gas is removed at one or more outlets in or near the base of the plasma chamber. Optionally, the process gas can be recirculated to the inlet using a pump. An advantage of such a system is that high velocity gas flow directed towards the substrate transports activated gas species from the plasma to the substrate by convection. This aids in increasing growth rates when compared with systems which rely upon diffusion of activated gas species from the plasma to the substrate. Furthermore, as previously discussed, by increasing the hydrogen gas flow rate using such an arrangement it is possible to push more atomic hydrogen to peripheral regions of the polycrystalline diamond wafer thus increasing the rate at which non-diamond carbon is etched from the growth surface and improving the quality of the material in peripheral regions of the growing wafer.

An alternative or additional solution is to provide a gas inlet nozzle array having a plurality of gas inlet nozzles directed towards the growth surface of the substrate and disposed over an area sufficiently large to ensure that a sufficiently large concentration of atomic hydrogen is provided in peripheral regions of a polycrystalline diamond wafer during growth. In this regard, a relatively high number of nozzles can be closely spaced to ensure a relatively uniform flow of gas. It has been found that providing a relatively high number density of nozzles in an array improves the uniformity of gas flow towards the substrate in use and allows the plasma to be uniformly flattened and shaped relative to the substrate to achieve uniform diamond film formation at high rates over a relatively large area. It has also been found to be useful to provide relatively small area nozzles such that the area of the nozzle array is largely made up of the space in-between the nozzles rather than the area of the nozzle outlets themselves. As such, whereas it has been found to be advantageous to provide a relatively large number density of nozzles in relation to the area of the nozzle inlet array, it has also been found to be advantageous to provide an array in which the ratio of the area of the nozzle inlets divided by the area of the nozzle array as a whole is low. It has been found that small nozzles are advantageous for providing high velocity directed gas flows. However, it is also desired to have a relatively uniform gas flow over a relatively large area for uniform deposition of a diamond film over a relatively large area. Accordingly, a combination of relatively small inlet nozzle size and a relatively high number density of such nozzles has been found to be advantageous to achieve a balance between high velocity directed gas flows and uniformity of gas flow over a relatively large area.

In light of the above, a modified gas flow system may comprise a gas inlet nozzle array comprising a plurality of gas inlet nozzles disposed opposite the substrate holder for directing process gases towards the substrate holder, the gas inlet nozzle array comprising: at least six gas inlet nozzles disposed in a substantially parallel or divergent orientation relative to a central axis of the plasma chamber (by substantially parallel we mean at least within 10°, 5°, 2°, or 1° of a perfect parallel arrangement); a gas inlet nozzle number density equal to or greater than 0.1 nozzles/cm², (but preferably much higher for certain applications) wherein the gas inlet nozzle number density is measured by projecting the nozzles onto a plane whose normal lies parallel to the central axis of the plasma chamber and measuring the gas inlet number density on said plane; and a nozzle area ratio of equal to or greater than 10 (but preferably much higher for certain applications), wherein the nozzle area ratio is measured by projecting the nozzles onto a plane whose normal lies parallel to the central axis of the plasma chamber, measuring the total area of the gas inlet nozzle area on said plane, dividing by the total number of nozzles to give an area associated with each nozzle, and dividing the area associated with each nozzle by an actual area of each nozzle.

(B) The Plasma Chamber

The plasma chamber is configured to form a resonance cavity supporting a standing microwave in use. According to one configuration the plasma chamber is configured to support a $TM_{01n}$ standing microwave in use, e.g. a $TM_{011}$ mode. The operational frequency may be in a range 400 to 500 MHz or 800 to 1000 MHz.

It has also been found to be advantageous to provide a cylindrical resonance cavity configured to have a diameter which satisfies the condition that a ratio of the resonance cavity height/the resonance cavity diameter is in the range 0.3 to 1.0, 0.4 to 0.9, or 0.5 to 0.8. Such a ratio constitutes a relatively small diameter cavity when compared to prior art arrangements. Although it would seem counter-intuitive, it has been found that it is advantageous to use a plasma reactor chamber having a relatively small diameter to form a uniform, stable, large area plasma for achieving uniform CVD diamond growth over large areas. A relatively small diameter cavity can provide the following beneficial technical effects:

(i) Improve resonance mode purity within the chamber and avoid complex interactions between numerous modes during operation over the long time-scales required for CVD diamond synthesis. For example, a small diameter chamber can reduce the problem of slight temperature instabilities in the CVD diamond growth surface stimulating an unwelcome higher order mode.

(ii) A cavity formed within a specific, relatively small, diameter range is considered to allow the formation of localized higher order axis-symmetric modes at the substrate making the E-field across the substrate more uniform without forming very intense radial E-fields at the top corners of the substrate.

(iii) A small diameter cavity which has a relatively low Q factor is more easy to start and tune, and is less sensitive to variations in microwave source frequency.

Such a relatively small diameter cavity also helps to alleviate the problem of complex and interacting gas convection currents forming within the chamber leading to plasma instability. That is, the present inventors consider that a small diameter cavity provides a more simple and easier to control system in terms of both gas flow and microwave power within the plasma chamber such that a more uniform, stable, large area plasma can be formed and maintained to achieve uniform CVD diamond growth over large areas. At the same time, the diameter of the cavity should not be so small that the plasma becomes compressed and non-uniform across the substrate.

For example, the resonance cavity height, as measured from the base to the top plate of the plasma chamber, may lie in a range: 300 mm to 600 mm, 300 mm to 500 mm, or 400 mm to 500 mm at a microwave frequency fin the range 400 MHz to 500 MHz; or 150 mm to 300 mm, 150 mm to 250 mm, or 200 mm to 250 mm at a microwave frequency f in the range 800 MHz to 1000 MHz. The resonance cavity diameter may lie in the range: 400 mm to 1000 mm, 500 mm to 900 mm, or 600 mm to 800 mm at a microwave frequency f in the range 400 MHz to 500 MHz; or 200 mm to 500 mm, 250 mm to 450 mm, or 300 mm to 400 mm at a microwave frequency f in the range 800 MHz to 1000 MHz. The resonance cavity may have a volume in a range: 0.018 m³ to 0.530 m³, 0.062 m³ to 0.350 m³, 0.089 m³ to 0.270 m³, or 0.133 m³ to 0.221 m³ at a microwave frequency f in the range 400 to 500 MHz; or 0.002 m³ to 0.06 m³, 0.007 m³ to 0.04 m³, 0.01 m³ to 0.03 m³, or 0.015 m³ to 0.025 m³ at a microwave frequency f in the range 800 MHz to 1000 MHz.

One potentially problem when using a small cavity arrangement as described above is that of over heating in wall components of the chamber. However, it has been found to be advantageous to provide an arrangement in which the walls of the resonance cavity are exposed to the plasma in use, i.e. the plasma is not contained within a bell jar, to avoid silicon contamination. Plasma reactor vessels are usually manufactured from welded stainless steel as this is the accepted material of choice for ultra-high vacuum (UHV) chambers. However, it has been found that this creates problems with arcing at interfaces, soot formation on hot surfaces, and generally poor heat transfer. Furthermore, these chambers cost a large amount of money to build. Aluminium has been found to be a better material thermally and is also easy to machine. Thus, while stainless steel is a good material for vacuum chambers, its very poor thermal performance makes it not well suited to use in areas where high power densities are experienced. Materials such as aluminium, while not traditionally regarded as suitable for high vacuum, are actually quite good for reasonably high vacuum usage where conventional elastomer seals can be used.

In light of the above, the resonance cavity may comprise internal walls configured to be exposed to a plasma formed within the resonance cavity in use, the internal walls comprising metallic surfaces forming at least 75%, 80%, 85%, 90% or 95% of a total surface area of the internal walls within the resonance cavity. The metallic surfaces may be made of aluminium or an alloy thereof comprising at least 80%, 90%, 95%, or 98% by weight of aluminium. Furthermore, a portion of the internal walls formed by the annular dielectric window, is preferably no more than 25%, 20%, 15%, 10%, or 5% of the total surface area of the internal walls within the resonance cavity.

Although a basic cylindrical chamber configuration is illustrated in FIG. 2, additional optional features may be provided. For example, projections from a wall of the chamber may be provided in certain instances. These may be provided to modify the electric field formed near the substrate, introducing a vertical asymmetry which increases the electric field above the substrate relative to the electric field at an opposite end of the plasma chamber where plasma formation is not desirable. In addition, such projections can function as a mode filter, aiding stability and/or purity of the electric field which drives the plasma. Such projections may also be provided to alter the thermal properties of the plasma which can aid in improving uniformity of CVD diamond growth, function as a physical boundary to confine the plasma in use and prevent the plasma from deviating from an axially central location above the substrate, and/or interrupt gas flow up a side wall of the plasma chamber thereby reducing gas entrainment and unwanted convection currents within the chamber which would otherwise destabilize the inlet gas streams and/or the plasma. In such cases, it should be ensured that any additional structure provided within the plasma chamber have a high degree of rotational symmetry and alignment with the rotational symmetry axis of the plasma chamber to achieve good, uniform quality diamond wafers.

(C) The Substrate Mounting Configuration

It has been found that the electric field profile is significantly perturbed when a substrate is introduced into the resonance cavity as can be shown by modelling or empirical measurement. In this regard, FIGS. 5(a) to 5(c) illustrate electric field profile plots showing how the electric field varies with differing height of a substrate within a resonance cavity of a plasma reactor. The plots show the magnitude of the electric field $E_z$ on the Y-axis against the lateral position X across the diameter of the resonance cavity above the substrate.

FIG. 5(a) illustrates the electric field profile when the growth surface of the substrate S is located just above a base B of the resonance cavity C. The electric field profile is dominated by that of the empty chamber which is a $J_0$ Bessel function for a $TM_{01n}$ chamber. There is only a slight contribution to the electric field magnitude from the upper edge of the substrate forming a coaxial mode set up between the substrate and the chamber wall. In this arrangement, the electric field is high above a central region of the substrate and drops off significantly towards the edge of the substrate. As such, this electric field profile results in poor CVD diamond growth in a peripheral region of the substrate growth surface.

FIG. 5(b) illustrates the electric field profile when the growth surface of the substrate S is located high above the base B of the resonance cavity C. The electric field profile is now dominated by the coaxial mode set up between the substrate and the chamber wall which decays evanescently into a central region of the chamber. In this arrangement, the electric field is high above a peripheral region of the substrate and drops off towards the central region of the substrate. As such, this electric field profile results in poor CVD diamond growth in a central region of the substrate growth surface.

FIG. 5(c) illustrates the electric field profile when the growth surface of the substrate S is located at the correct height above a surrounding surface within the resonance cavity C. The electric field profile of the empty chamber is balanced with the coaxial mode set up between the substrate and the chamber wall to form a substantially uniform electric field region over the majority of the substrate with a ring of higher electric field localized around the substrate edge. The central region of the electric field is substantially uniform but has a slightly lower electric field region just inside the ring of higher electric field localized around the substrate edge. One would think that this lower electric field region would lead to poor CVD diamond growth at this region of the growth surface. However, in practice it has been found that the higher electric field ring immediately outside the region of lower electric field aids in pulling the plasma outwards, compensating for the slight non-uniformity in the central region and resulting in a large, flat, uniform plasma over the majority of the substrate enabling uniform CVD diamond growth over large areas. In practice, it has been found that a large, flat, uniform plasma over the majority of the substrate enabling uniform CVD diamond growth over large areas can be achieved when a ratio of substrate diameter/height of the growth surface of the substrate is in a range 10 to 14, 11 to 13.5, or 11.0 to 12.5, wherein the height of the growth surface of the substrate is relative to a mean height of a surface surrounding the substrate.

According to certain embodiments of the present invention the substrate holder has a rotational axis of symmetry lying within 1.0 mm, 0.5 mm, 0.25 mm, 0.2 mm, 0.15 mm, 0.10 mm, or 0.05 mm of the central rotational axis of symmetry of the resonance cavity. Furthermore, in use a substrate may be located and aligned on the substrate holder such that a the rotation axis of symmetry of the substrate lies within 1.0 mm, 0.5 mm or 0.2 mm of the central rotational axis of symmetry of the resonance cavity when located over the substrate holder.

For an arrangement in which the substrate holder is the same diameter as the substrate, the substrate holder will be located wholly under the substrate and the surface surrounding the substrate may be formed by the base of the plasma chamber. As such, in this case the mean height of the surface surrounding the substrate will equate to the height of the base B of the plasma chamber C and the height of the growth surface of the substrate, $H_{gs}$, will be measured from the base of the plasma chamber surrounding the substrate S and substrate holder SH as illustrated in FIG. 6(a). Alternatively, for an arrangement in which the substrate holder is much larger than the substrate thus forming a large flat surface which surrounds the substrate, the mean height of the surface surrounding the substrate will equate to a top surface of the substrate holder. As such, in this case the height of the growth surface of the substrate, $H_{gs}$, will be measured from the top surface of the substrate holder SH surrounding the substrate S as illustrated in FIG. 6(b). For an arrangement in which the substrate holder extends outwards from the substrate with a sloped, curved, or stepped top surface surrounding the substrate then the mean height of the local surrounding surface, $H_{lss}$, can be defined by a mean of a height, $H_{local}$ of a cross section between the edge of the substrate, at Rs, and a distance approximately two times the thickness of the substrate, 2×Ts, away from the substrate edge, taken in a radial direction, X:

$$H_{lss} = \frac{1}{2Rs} \int_{Rs}^{Rs+2Ts} H_{local}\, dX$$

Such an arrangement is illustrated in FIG. 6(c) for a sloped substrate holder. For example, for a substrate holder having a top surface sloping away from the substrate at an angle of 45° to a distance 2×Ts from the substrate in a radial direction, the mean height of the surface surrounding the substrate will equate to half the height of the substrate holder SH. As such, in this case the height of the growth surface of the substrate, $H_{gs}$, will be measured from half the height of the substrate holder SH.

In relation to the above, it has been found that providing a step of a particular height between the substrate growth surface and the local surrounding surface perturbs the electric field profile of the plasma chamber in such a way that the electric field profile of the empty chamber is balanced with a coaxial mode set up between the substrate and the chamber wall to form a substantially uniform electric field region over the majority of the substrate with a ring of higher electric field localized around the substrate edge as previously described.

The magnitude of the coaxial mode set up between the substrate and the chamber wall can also be affected by the ratio of a resonance cavity diameter/substrate diameter. Accordingly, in certain arrangements it may be preferred to provide a configuration in which a ratio of resonance cavity diameter/substrate diameter is in the range 1.5 to 5, 2.0 to 4.5, or 2.5 to 4.0, wherein the resonance cavity diameter is measured at a height less than 50%, 40%, 30%, or 20% of a height of the resonance cavity. In one particularly preferred arrangement the aforementioned ratios hold when the resonance cavity diameter is measured at a height of the growth surface of the substrate.

Providing suitable substrate dimensions and correctly locating the substrate within the plasma chamber can thus aid providing a more uniform plasma over larger areas. Furthermore, the uniform plasma achieved by such configurations also provides relatively uniform heat flow towards the substrate which has been found to aid in alleviating the problem of cracking of the CVD diamond when the CVD diamond cools after growth. In this regard, stress balance in a CVD diamond wafer is largely determined by the variation in growth temperatures over the diamond wafer. Hotter regions during growth contract to a greater extent during cool down, and are therefore in tension; cooler regions contract less, and therefore remain in compression. Variations in stress, in particular local tensile stresses, within the CVD diamond wafer during cooling can result in cracking As such, large variations in substrate temperature are not desirable.

That said, one potential problem using the previously described arrangement is that the high electric field ring disposed around the edge of the substrate can lead to higher substrate temperatures at the edge of the substrate and this can potentially lead to cracking of the substrate when the CVD diamond material cools after growth. Indeed, rather than having a completely uniform temperature across the substrate growth surface as might be intuitively desired, the present inventors consider that it is actually desirable to ensure that the edge temperature of the substrate growth surface is lower that the temperature in a central region of the substrate growth surface. The reason for such an arrangement is that crack propagation can be minimised by ensuring that compressive regions within the CVD diamond material are near where cracks can originate, i.e. near the edge of the CVD diamond wafer. Accordingly, keeping the edge of the substrate growth surface slightly cooler than a central region during growth is considered to be advantageous in forming a compressive region near the edge of the resulting CVD diamond wafer. If a crack is initiated at an edge of a CVD diamond wafer during cooling, the compressive region near the edge of the CVD diamond wafer prevents the crack from propagating towards the centre of the CVD diamond wafer. As such, any cracks which are initiated tend to remain short and located at an outer edge of the CVD diamond wafer which can subsequently be processed to remove any minor edge damage. In this regard, it is advantageous to provide a substrate temperature control system an example of which is illustrated in the reactor configuration of FIG. 2.

The substrate 5 is spaced apart from the substrate holder 4 by spacer wires or spacer pads 20 to define a gas gap 22 between a supporting surface of the substrate holder 4 and a rear surface of the substrate 5. Furthermore a gas supply system 24 is coupled to the gas gap 22 via a supply pipe 26 which extends from the gas supply system 24 through the substrate holder 4 and is configured to supply gas into the gas gap 22 through one or more outlets in the supporting surface of the substrate holder. A coolant liquid supply system 28 is also provided for cooling the substrate holder 4.

The coolant liquid supply system 28 provides a rough basic cooling to the substrate holder. However, this system has been found to be insufficiently precise for the fine temperature control of the substrate which is considered to be required by the present inventors in order to obtain high quality, uniform deposition of CVD diamond over large areas. Accordingly, the gas supply system 24, 26 is provided in order to allow more precise control of the substrate temperature. The gas supply system may be configured to inject at least two gases having different thermal conductivities into the gas gap below the substrate and vary a ratio of the at least two gases in order to control the temperature of the substrate on the substrate holder. For example, the gas supply system may utilize a mixture of a light gas such as hydrogen and a heavy gas such as argon which is less thermally conductive. Advantageously, the gases used to control the temperature of the substrate are ones which are also utilized in the main process chemistry so that additional gas sources are not required. If the edge temperature of the substrate is too high relative to the central region of the substrate, the proportion of heavy gas relative to light gas can be increased to reduce the thermal conductivity of the gas under a central region of the substrate, thus causing the central region of the substrate to heat up relative to the edge of the substrate. Conversely, if the edge temperature of the substrate is too low relative to the central region of the substrate, the proportion of light gas relative to heavy gas can be increased to increase the thermal conductivity of the gas under a central region of the substrate, thus causing the central region of the substrate to cool down relative to the edge of the substrate. The absolute temperature of the substrate as well as the relative temperature of different regions of the substrate can also be controlled by varying gas flow and gas composition within the gas gap under the substrate.

The spacer wires 16 may be configured to define a central gas gap cavity under the substrate so that the gas pools in the central gas gap cavity. For example, the spacer wires 16 can be each arcuate in shape and configured into a ring with gaps therebetween through which gas can flow. The spacer elements may be electrically conductive and/or may be fixed in place with an electrically conductive adhesive such as Silver DAG™ which has been found to be useful in ensuring a good electrical contact between the spacer elements and the substrate holder. This aids in preventing the problem of arcing under the substrate which can detrimentally affect temperature control. It has also been noted that the position of gaps between the ring sections of the spacer wires can produce a variation in thickness of the diamond wafer. If desired, the number and position can be adjusted to compensate for other non-uniformities inherent in diamond wafers produced by a given reactor.

The microwave plasma reactor further comprises one or more temperature measurement devices configured to take at least two temperature measurements, including one or more measurements in a central region of the growth surface of the substrate and one or more measurements in a peripheral region of the growth surface of the substrate as previously described. The temperature measurements may be taken simultaneously or within a short time interval of each other and the substrate temperature control system may be used to ensure that the temperature gradient does not move outside the previously described ranges. The temperature measurement device may comprise a pyrometer 30 as illustrated in FIG. 2. Two pyrometers may be provided, one to take the central temperature measurements and one to take the peripheral temperature measurements.

Microwave plasma reactors may comprise further features such as a metallic temperature modifying ring disposed around the substrate. Such a temperature modifying ring performs two roles: it moves the ring of high electric field away from the substrate edge; and, being a separately heated (by plasma) and cooled (by the chamber base) item, it directly modifies the substrate edge temperature. As such, the ring can function to cool the edge of the substrate, reducing the magnitude of any tensile stresses, making cracking of the CVD diamond less likely. In addition, adjusting the temperature modifying ring disposed around the substrate can also modify overgrowth of CVD diamond down the edge of the substrate thereby aiding release of the CVD diamond material from the substrate. As with previously described structures, if any such a ring structure is provided within the plasma chamber then it should be ensured that it is rotationally symmetric and precisely aligned relative to the rotational axis of the plasma chamber to prevent asymmetries which are detrimental when growing large area synthetic diamond wafers.

The substrate temperature control system may be configured to control the temperature of the growth surface of the substrate during CVD diamond growth thereon to fulfil the condition: 5° C. $<T_c-T_e<120°$ C.; 10° C. $<T_c-T_e<100°$ C.; 10° C. $<T_c-T_e<80°$ C.; 20° C. $<T_c-T_e<80°$ C.; or 20° C. $<T_c-T_e<60°$ C., where $T_c$ is a temperature in the central region of the growth surface and $T_e$ is a temperature in the peripheral region of the growth surface. If Tc-Te becomes too large, excessive tension may be created in the central region of the CVD diamond wafer during cooling, leading to cracking in the central region of the CVD diamond wafer. If Tc-Te becomes too small, compressive regions will not form near the edge of the CVD diamond wafer and any cracks which initiate at the edge of the wafer are more likely to propagate across the CVD diamond wafer resulting in very long cracks, including complete wafer fracture.

Even when utilizing arrangements such as those described above, a number of problems may still exist, although these may be substantially alleviated by the previously described arrangements. For example, in some instances there may still be issues of non-uniform CVD diamond growth across the substrate, diamond wafer delamination from the substrate during CVD diamond growth, and crack initiation and/or propagation during cooling after growth of the CVD diamond wafer, particularly when larger substrates are used for growing large area polycrystalline diamond discs. This is particularly problematic as there is an on going need to increase the area over which high quality, uniform CVD diamond can be grown. Furthermore, these problems tend to be exacerbated when the substrates are reused in subsequent growth runs. This is particularly problematic for refractory metal substrates which are expensive and reuse is desirable in an economically competitive industrial process.

One possible solution considered by the inventors was that the quality of the growth surface was in some way affecting the release of a CVD diamond wafer on cooling after growth thus causing cracking However, it was found that processing the growth surface to have a more precisely defined flatness and roughness did not in itself solve the problems. After much research focussed at addressing these issues, the present inventors have surprisingly found that the problems they have observed are a result of small variations in temperature across the growth surface of the substrate caused by very minor variations in the height of the gas gap under the substrate. In particular, the present inventors found that although the cylindrical refractory metal substrates provided by their supplier have nominally planar front and rear surfaces, these surfaces are not sufficiently flat. Minor flatness variations in a rear surface of the substrate result in minor variations in the height of the gas gap and it has been found that this results in differential cooling across the substrate. The temperature variations caused by the variations in the gas gap height result in stress variations in the CVD diamond on cooling after CVD diamond growth which can cause the diamond wafer to crack in at least a proportion of growth runs resulting in reduced yields.

While the previously described arrangements can control variations in temperature which are circumferentially symmetric, it can be more difficult to control temperature variations which are not circumferentially symmetric such as those caused by variations in the gas gap height. For example, refractory metal substrates tend to sag and buckle during use (despite being a long way from their melting point). Uniform sag mainly modifies Tc-Te which can be controlled as previously described. However, buckling introduces non-uniformities in the temperature around the wafer edge which are not symmetric. Therefore it is not easy to maintain the whole edge in compression. Typical buckling magnitudes can be greater than 20 micron (peak to valley). For a gas gap of approximately 200 microns, this corresponds to a 10% variation in thickness, and corresponding temperature variation. This can result in up to 60° C. variations in temperature around the wafer edge.

In order to solve this problem, it is advantageous to ensure that the height h of the gas gap varies by no more than 100 µm, 80 µm, 60 µm, 40 µm, 20 µm, 10 µm, 5 µm, or 2 µm. This may be achieved, for example, by further processing the rear surface of substrates provided by suppliers to have a very precisely defined profile which is complementary to the profile of the supporting surface of the substrate holder. For example, if the supporting surface of the substrate holder is flat, then the rear surface of the substrate should be processed to ensure that it is very precisely flat.

Accordingly, control of rear surface substrate shape by mechanical means (preferably uniform, non-directional processing, e.g. lapping rather than grinding) has been found to be advantageous. Furthermore, the supporting surface of the substrate holder may also be processed to have a precisely defined profile which is complementary to the rear surface of the substrate.

In addition to the above, it has also been found that some cylindrical refractory metal substrates provided by suppliers do not result in uniform, high quality CVD diamond wafers, even if both front and rear surfaces were processed as outlined above. Commercially available refractory metals often contain small amounts of graphite forming impurities such as iron and nickel. Even very small proportions of such impurities have been found to affect CVD diamond growth on the growth surface of such a substrate. Accordingly, in addition to applying the precise processing of both front and rear surfaces of the substrate as previously described, it is advantageous to use a carbide forming refractory metal substrate which has very high chemical purity with less than 0.5%, 0.1%, 0.075%, 0.05%, 0.025%, 0.01%, 0.005%, or 0.001% by weight of graphite forming impurities at the growth surface of the substrate.

Optionally, the growth surface has a surface roughness $R_a$ in the range 1 nm to 1 µm. It has been found that the roughness of the growth surface can affect both the crystal structure of the CVD diamond grown thereon and adhesion strength of the CVD diamond to the substrate. It has been found that a surface roughness $R_a$ in the range 1 nm to 1 µm has been found to be particularly useful to provide sufficient adhesion to the CVD diamond during growth to prevent early delamination during growth while providing a sufficiently low adhesion such that the diamond material can be released from the substrate on cooling after CVD growth without the material cracking Preferred range of surface roughness may be 1 nm to 500 nm, 10 nm to 500 nm, 10 nm to 200 nm. Typically, the refractory metal discs are first lapped on a cast iron wheel using diamond grit suspended in a lapping fluid. In general, the lapping process is used for bulk material removal and also to achieve the required flatness for the given process. There are a few processes where the as-lapped surface is used. A typical $R_a$ value for the lapped finish is 100 nm to 500 nm. However, usually the lapped surface is then further processed using, for example, a grinding/polishing machine and using a finer grit to obtain a lower surface roughness value. Prior to CVD diamond growth, the refractory metal substrates may be cleaned to ensure all contamination from the lapping process has been removed and/or seeded to aid nucleation for diamond growth thereon.

Process Conditions

Using the aforementioned apparatus a process has been developed for fabricating thick, high thermal conductivity polycrystalline CVD synthetic diamond material at high growth rates. The process comprises:

loading a refractory metal substrate into a CVD reactor;

locating a refractory metal guard ring around a peripheral region of the refractory metal substrate, the refractory metal guard ring defining a gap between an edge of the refractory metal substrate and the refractory metal guard ring having a width 1.5 mm to 5.0 mm;

introducing microwaves into the CVD reactor at a power such that the power density in terms of power per unit area of the refractory metal substrate is in a range 2.5 to 4.5 W mm$^{-2}$;

introducing process gas into the CVD reactor wherein the process gas within the CVD reactor comprises a nitrogen concentration, calculated as molecular nitrogen $N_2$, in a range 600 ppb to 1500 ppb, a carbon containing gas concentration in a range 1.5% to 3.0% by volume, and a hydrogen concentration in a range 92% to 98.5% by volume;

controlling an average temperature of the refractory metal substrate to lie in a range 750° C. to 950° C. and to maintain a temperature difference between an edge and a centre point on the refractory metal substrate of no more than 80° C.

growing polycrystalline CVD synthetic diamond material to a thickness of at least 1.3 mm on the refractory metal substrate; and cooling the polycrystalline CVD synthetic diamond material to yield a polycrystalline CVD synthetic diamond material having a thickness of at least 1.3 mm, an average thermal conductivity at room temperature through the thickness of the polycrystalline CVD synthetic diamond material of at least 2000 Wm$^{-1}$K$^{-1}$ over at least a central area of the polycrystalline CVD synthetic diamond material, wherein the central area is at least 70% of a total area of the polycrystalline CVD synthetic diamond material, a single substitutional nitrogen concentration no more than 0.80 ppm over at least the central area of the polycrystalline CVD synthetic diamond material, and wherein the polycrystalline CVD synthetic diamond material is substantially crack free over at least the central area thereof such that the central area has no cracks which intersect both external major faces of the polycrystalline CVD synthetic diamond material and extend greater than 2 mm in length.

The process comprises the use of increased nitrogen and carbon containing gas to increase growth rates while using a higher power density to reduce the uptake of non-diamond carbon and nitrogen within the growing polycrystalline CVD synthetic diamond material. While high power density conditions have been found to be advantageous for fabricating thick, high thermal conductivity polycrystalline CVD synthetic diamond material at high growth rates, such conditions are difficult to control in a uniform manner. The microwave plasma reactor and substrate configurations as previously described are capable of sustaining such conditions in a stable and uniform manner in order to achieve the present invention. By combining developments in reactor design and process design it has been possible to achieve the fabrication of thick, high thermal conductivity polycrystalline CVD synthetic diamond material at high growth rates.

The diameter of the refractory metal substrate may lie in a range 60 mm to 120 mm, 80 mm to 110 mm, 90 mm to 110 mm, or 95 mm to 105 mm. The diameter of the refractory metal substrate may be optimized to balance the following parameters:

(a) Number of product wafers which can be extracted from an as-grown wafer. For example, a 90 mm diameter substrate has a maximum yield of 12 20 mm diameter product wafers whereas a 100 mm diameter substrate has a maximum yield of 16 20 mm diameter product wafers if cut from the as-grown wafer in a symmetric pattern. This can actually be increased to 17 product wafers if cut from the as-grown 100 mm diameter wafer with an irregular, offset pattern.

(b) Power density. If the diameter of the substrate is decreased then the power density per unit area of the substrate is increased for a given microwave power input to the reactor chamber. The power density may be defined as the total power absorbed per unit area of the substrate and/or the total power delivered per unit area of the substrate.

(c) Power/pressure handling capability. If the diameter of the substrate is increased then it has been found that the power/pressure handling capability of the substrate can be increased. For example, it has been found that 100 mm substrates have a higher power/pressure handling capability than 90 mm substrates, at least for the reactor configuration described herein, and readily give higher growth rates for apparently similar quality material.

(d) Uniformity of product material. If the diameter of the substrate is increased then it has been found that the quality of material can decrease in peripheral regions of an as-grown wafer.

Taking all the aforementioned parameters into account it has been found that for synthesis of thick, high thermal conductivity polycrystalline at high growth rates a substrate diameter of around 100 mm is preferred.

The power density may be in a range 2.75 to 4.25 W mm$^{-2}$, 3.0 to 4.0 W mm$^{-2}$, 3.2 to 3.8 W mm$^{-2}$, or 3.3 to 3.6 W mm$^{-2}$. Furthermore, an operating pressure during growth of the polycrystalline CVD synthetic diamond material may be controlled within a range 100 to 300 torr, 150 to 250 torr, 175 to 225 Torr, or 195 to 205 Torr. While high power density and high pressure conditions have been found to be advantageous for synthesis of thick, high thermal conductivity polycrystalline diamond material at high growth rates, if the power density and pressure are made too high then the growth conditions become less stable and more difficult to control in a uniform manner.

Using the substrate diameter and power density/gas pressure parameters defined above, it has been found that the following process gas composition is preferred:

(a) a nitrogen concentration, calculated as molecular nitrogen $N_2$, in a range 600 ppb to 1500 ppb, 700 ppb to 1300 ppb, 800 ppb to 1200 ppb, or 900 ppb to 1100 ppb;

(b) a carbon containing gas concentration in a range 1.5% to 3.0%, 1.6% to 2.5%, 1.7% to 2.3%, or 1.8% to 2.1% by volume;

(c) a hydrogen concentration in a range 92% to 98.5%, 94% to 97%, or 95% to 96% by volume.

In this regard, high nitrogen and carbon containing gas concentrations are desirable to increase the growth rate of the material. However, if the nitrogen and carbon containing gas concentrations are made too high then the quality and thermal conductivity of the product material decreases below desired levels. An inert gas such as argon may also be introduced into the process gas.

In relation to the above, the carbon containing gas concentration and the hydrogen concentration are calculated as the concentration of those gases introduced into the CVD reactor. Nitrogen gas is also added into the CVD reactor but is also present as an impurity. The nitrogen concentration in the CVD reactor may be measured by, for example, gas chromatography as described in WO0196633, and is the sum of the nitrogen gas intentionally added into the CVD reactor and the nitrogen present as an impurity. Nitrogen may be present in a number of different forms within the CVD reactor including atomic nitrogen and various forms of molecular nitrogen. As such, in the present specification nitrogen concentrations have been calculated as the equivalent concentration of molecular nitrogen $N_2$. Typically, nitrogen may be present as an impurity at a level up to around 300 ppb depending on the purity of the source gases utilized. The concentration of nitrogen intentionally added (i.e. excluding impurity nitrogen content) will typically be less than the measured nitrogen concentration which includes impurities. For example, the nitrogen concentration intentionally added into the CVD reactor may be in a range 600 ppb to 1200 ppb, 600 ppb to 1000 ppb, 620 ppb to 800 ppb, or 640 ppb to 700 ppb.

The average temperature of the refractory metal substrate may be controlled to lie in a range 775° C. to 900° C., 800° C. to 875° C., or 820° C. to 860° C. Furthermore, the temperature difference between an edge and a centre point on the refractory metal substrate may be controlled to be no more than 60° C., 40° C., 20° C., or 10° C. The substrate temperature can affect growth rates and impurity uptake. Furthermore, large temperature differences between an edge and a centre point of the substrate can lead to thermally induced stress and wafer cracking on cooling. As such, careful control of substrate temperature using a gas gap arrangement as previously described is advantageous in alleviating these problems.

However, even utilizing such substrate temperature control, it has been found that synthesis of thick, high thermal conductivity polycrystalline diamond material at high growth rates using high power densities can still lead to thermally induced cracking This problem has been traced to the edge temperature of the substrate being too high under the desired growth conditions. Accordingly, to lower the edge temperature of the substrate a refractory metal guard ring can be located around a peripheral region of the refractory metal substrate, the refractory metal guard ring defining a gap between an edge of the refractory metal substrate and the refractory metal guard ring having a width 1.5 mm to 5 mm. The refractory metal guard ring must be located and configured to remove heat from the edge of the substrate while not being positioned and configured such that polycrystalline CVD diamond material overgrows the guard ring inhibiting release of the wafer after growth.

Figure 7:
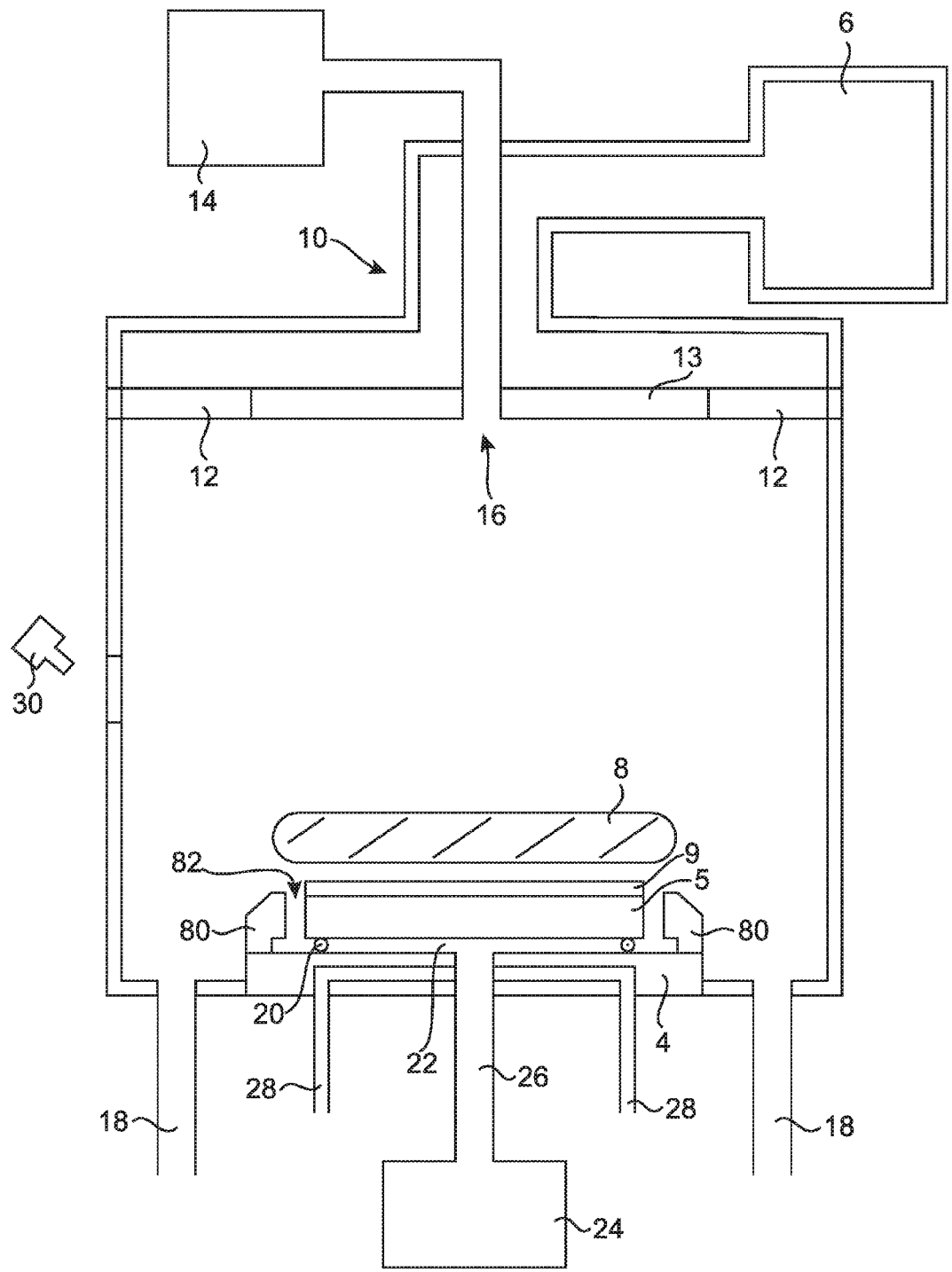
FIG. 7 illustrates a microwave plasma reactor similar to that illustrated in FIG. 2 with a refractory metal guard ring disposed around a peripheral region of the substrate.

In light of the above, a refractory metal guard ring can be located around a peripheral region of the refractory metal substrate, the gap between the edge of the refractory metal substrate and the refractory metal guard ring having a width in a range 1.5 mm to 5 mm, 2 mm to 4 mm, or 2.5 mm to 3.5 mm. The height, cross-sectional width, and cross-sectional shape can be configured to optimize temperature control at the edge of the substrate while alleviate problems of diamond growth on the guard ring. FIG. 7 shows a CVD reactor including a suitably configured refractory metal guard ring. The CVD reactor is similar in the same as that shown in FIG. 2 and like reference numerals have been used for like parts. The substrate mounting configuration has been modified to include a guard ring 80 disposed around the refractory metal substrate 5. As before, the substrate 5 is mounted on spacer wires 20 to form a gas gap 22 between the substrate holder 4. The guard ring 80 is disposed directly on the substrate holder 4 around a peripheral region of the substrate defining a gap 82 between the guard ring 80 and the edge of the substrate 5. The height of the guard ring above the support substrate is approximately equal to the height of the upper surface of the substrate. For example, the height of the guard ring may be within 20 mm, 15 mm, 10 mm, 5 mm, or 3 mm of the height of the substrate.

FIG. 8 illustrates a cross-section of the guard ring 80 in more detail. The outer surface of the guard ring include a vertical section 84, a sloped section 86, and a flat top section 88. The width of the base 90 can be optimized for conducting heat into the substrate holder 4 in use. The greater the contact area between the guard ring base 90 and the substrate holder, the greater the degree of cooling of the guard ring. Initially, a guard ring having a base contact of 1 mm in width was utilized but this resulted in diamond growth on the top surface of the guard ring. Accordingly, the base contact was increased in width to 3 mm in order to reduce the temperature of the guard ring during operation. This modification was successful in preventing growth of diamond material over the guard ring.

Product

Using the apparatus and process conditions as described above, it is possible to fabricate a thick, high thermal conductivity polycrystalline CVD diamond wafer at high growth rates. The polycrystalline CVD diamond wafer comprises:

an average thermal conductivity at room temperature through a thickness of the polycrystalline CVD synthetic diamond material of at least 2000 $Wm^{-1}K^{-1}$ over at least a central area of the polycrystalline CVD synthetic diamond material, wherein the central area is at least 70% of a total area of the polycrystalline CVD synthetic diamond material; and a single substitutional nitrogen concentration no more than 0.80 ppm over at least the central area of the polycrystalline CVD synthetic diamond material;

wherein the thickness of the polycrystalline CVD synthetic diamond material is at least 1.3 mm; and wherein the polycrystalline CVD synthetic diamond material is substantially crack free over at least the central area such that the central area has no cracks which intersect both external major faces of the polycrystalline CVD synthetic diamond material and extend greater than 2 mm in length.

As previously described, the increase in power density off-sets the increase the carbon containing gas and nitrogen in the synthesis process such that the non-diamond carbon content of the product is not unduly increased and the nitrogen content is actually decreased. This is due to an increase in atomic hydrogen flux to the growth surface which effectively cleans the material during growth allowing a high thermal conductivity material to be fabricated at higher growth rates. As such, the process gas composition and the power density may be balanced to achieve the desired product. In this regard, the polycrystalline CVD synthetic diamond wafer may comprise a single substitutional nitrogen concentration no more than 0.70 ppm, 0.60 ppm, 0.50 ppm, or 0.45 ppm. Furthermore, the polycrystalline CVD synthetic diamond wafer may comprise a single substitutional nitrogen concentration no less than 0.10 ppm, 0.20 ppm, 0.30 ppm, or 0.35 ppm. If too much nitrogen is provided then the growth rate is increased too much and the quality of material is too low. While the power density could be further increased to counteract this effect, the power handling capability of the apparatus to sustain stable growth is limiting. Conversely, if too little nitrogen is provided then the growth rate of the material is too low to achieve thick wafers in a commercially viable manner.

In relation to the above, it may be noted that the single substitutional nitrogen concentration can be measured spectroscopically by the increase in absorption at 270 nm. Samples are double side polished and acid cleaned. Spectra are then collected between 200-1800 nm. Raw spectrometer data is converted into absorption coefficient data through the equation $$A(cm^{-1}) = \ln 10 \frac{(S-B)}{t}$$

where A is the absorption coefficient, S is the measured signal from the spectrometer, B is the background signal taken at 1800 nm, and t is the thickness of the sample (cm). The single substitutional nitrogen content is proportional to the absorption coefficient increase at 270 nm, where the proportionality constant is 0.7114. The increase in absorption is calculated by subtracting a linear background from the region 240 nm to 300 nm. Data indicates that that the single substitutional nitrogen content of the new polycrystalline CVD synthetic diamond material grown at higher power densities and growth rates is approximately half that of material which has a comparable thermal conductivity but which is grown at lower power densities and growth rates.

Preferably, the polycrystalline CVD synthetic diamond wafer has an average thermal conductivity at room temperature through the thickness of the wafer which is at least 2025 $Wm^{-1}K^{-1}$, 2050 $Wm^{-1}K^{-1}$, 2075 $Wm^{-1}K^{-1}$, 2100 $Wm^{-1}K^{-1}$, 2125 $Wm^{-1}K^{-1}$, or 2150 $Wm^{-1}K^{-1}$. While going to higher thermal conductivities is possible, this generally requires a reduction in the carbon containing gas and/or nitrogen which results in a decrease in growth rate. In this regard, the present inventors have realized that for many high performance thermal applications a thermal conductivity at room temperature in a range 2000 $Wm^{-1}K^{-1}$ to 2200 $Wm^{-1}K^{-1}$ is adequate. Accordingly, balance growth rates against device requirements, the thermal conductivity at room temperature may be less than 2200 $Wm^{-1}K^{-1}$, 2180 $Wm^{-1}K^{-1}$, 2175 $Wm^{-1}K^{-1}$, or 2160 $Wm^{-1}K^{-1}$.

Thermal conductivity can be measured in thick diamond wafers using the proven relationship between thermal conductivity and the CHx component of the FTIR absorption spectrum. This relationship is described in "Thermal conductivity measurements on CVD diamond", by Twitchen et al, Diamond and related materials, 10 (2001) 731-735. The integrated area of the CHx components in the region 2760 $cm^{-1}$ to 3030 $cm^{-1}$ of the IR spectrum of the diamond window, once corrected with a linear baseline, has been shown to be quantitatively related to the thermal conductivity of diamond.

Several samples of polycrystalline CVD synthetic diamond material fabricated in accordance with the present invention have been measured to date using the aforementioned technique and have been found to have an average through-thickness thermal conductivity of around, and in some cases over, 2150 $Wm^{-1}K^{-1}$.

Alternatively, a laser flash technique can be used to measure thermal conductivity through the thickness of a polycrystalline CVD synthetic diamond material. Laser flash is a one-dimensional measurement of thermal diffusivity. The measurement involves the absorption of energy at the front face of a sample, and subsequently measuring the temperature rise profile at the rear face of that piece. The thermal diffusivity ($\alpha$) is given by the equation:

$$\alpha = 0.1388 \cdot \frac{d^2}{\tau_{\frac{1}{2}}}$$

where d is the thickness of the sample and $\tau_{1/2}$ is the time to half the maximum temperature. This thermal diffusivity can be converted to a thermal conductivity using the equation:

$$\alpha = \frac{k}{\rho c_p}$$

where k is the thermal conductivity, ρ is the density of the material, and $c_p$ is the specific heat capacity. The standard for laser flash measurement of thermal conductivity is BS EN 821-2:1997.

It should be noted that the thermal conductivity of a polycrystalline CVD synthetic diamond wafer will change on passing through the thickness of the wafer due to variations in grain size along with variations in impurity and/or defect concentration. As such, in the present specification thermal conductivities are measured as an average value through the thickness of a wafer of the polycrystalline CVD synthetic diamond material. If a measurement technique is not suitable for measuring thermal conductivity through the entire thickness of a wafer in a single measurement due to the wafer being too thick, then the wafer may be split into two or more thinner sections, the thermal conductivity of each section measured, and then an average thermal conductivity value calculated.

For example, laser flash measurements as previously described are difficult to perform on thick samples. The table below indicates laser flash data for samples taken from a 2700 micron thick polycrystalline CVD synthetic diamond wafer fabricated in accordance with an embodiment of the present invention:

|  | First 450 microns of material (0-450) | | | | | Final 450 microns of material (2250-2700) | | | |
| --- | --- | --- | --- | --- | --- | --- | --- | --- | --- |
|  | Sample 1 | Sample 2 | Sample 2 | Sample 4 | Sample 5 | Sample 6 | Sample 7 | Sample 8 | Sample 9 |
| Temperature (° C.) | 201 | 201 | 201 | 20 | 20 | 20 | 201 | 201 | 20 |
| Thickness (μm) | 455 | 454 | 456 | 452 | 463 | 451 | 452 | 450 | 462 |
| Half rise-time (μs) | 24.54 | 25.06 | 24.88 | 24.69 | 25.58 | 23.43 | 23.27 | 23.35 | 24.43 |
| Thermal diffusivity × $10^{-3}$ (m²/s) | 1.17 | 1.14 | 1.16 | 1.15 | 1.16 | 1.21 | 1.22 | 1.20 | 1.21 |
| Thermal conductivity (W/m K) | 2035 | 1984 | 2016 | 1996 | 2021 | 2094 | 2117 | 2092 | 2107 |
| TC average (W/m K) | | | 2010 | | | | | 2102 | |
| Standard deviation (W/m K) | | | 20 | | | | | 12 | |

Five samples of approximately 450 microns in thickness were taken from a nucleation face side of the polycrystalline CVD synthetic diamond wafer, i.e. the first 450 microns of the polycrystalline CVD synthetic diamond wafer. Four further samples were taken from a growth face side of the polycrystalline CVD synthetic diamond wafer, i.e. the last 450 microns of the polycrystalline CVD synthetic diamond wafer. As can be seen from the data, samples from the nucleation face side generally have a lower thermal conductivity and may dip slightly under the 2000 $Wm^{-1}K^{-1}$ limit such as in the case of samples 2 and 4. However, the average thermal conductivity through the entire wafer at any of the sample points across the diameter of the wafer was found to be significantly over the 2000 $Wm^{-1}K^{-1}$ limit.

In the above table, an average value for the samples taken from the first 450 micron portion of the wafer has been calculated as 2010 $Wm^{-1}K^{-1}$ whereas an average value for the samples taken from the last 450 micron portion of the wafer has been calculated as 2010 $Wm^{-1}K^{-1}$. The material between the lower and upper portions of the wafer has a thermal conductivity intermediate between the lower and upper portions but is similar to that of the upper portion. As such, the average thermal conductivity, calculated through the material and also across the material for the samples taken, is approximately 2090 $Wm^{-1}K^{-1}$.

In relation to the above, it will also be appreciated that a polycrystalline CVD synthetic diamond wafer grown according to the present invention may have a portion of it nucleation face removed by post-synthesis processing to increase the average through-thickness thermal conductivity of the wafer.

The polycrystalline CVD synthetic diamond wafer may have an as-grown diameter in a range 60 mm to 120 mm, 80 mm to 110 mm, 90 mm to 110 mm, or 95 mm to 105 mm. As previously discussed, the diameter may be optimized to balance the area of wafer produced against material quality, material uniformity, and the power handling capability of the substrate.

The polycrystalline CVD synthetic diamond wafer may have a thickness of at least 1.5 mm, 1.7 mm, 1.8 mm, 1.9 mm, 2.0 mm, 2.2 mm, 2.5 mm, 2.75 mm, 3.0 mm, 3.25 mm, or 3.5 mm. The thickness will depend on the intended end-use. As previously discussed, as material is grown to greater thickness the grain size of the polycrystalline material increases as does the rate of impurity uptake. As such, growing a high thermal conductivity wafer to very thick dimensions is difficult. However, the present inventors have demonstrated that the apparatus and process as described herein is capable of fabricating high thermal conductivity wafers over 3.5 mm in thickness.

The substrate configuration including temperature control via a gas gap and a suitably configured guard ring structure allow crack free wafers to spontaneously delaminate from the substrate on cooling. In this regard, the wafers may be substantially crack free over a central area of the wafer which is at least 75%, 80%, 85%, 90%, 95%, or 99% of the diameter of the wafer.

The as-grown polycrystalline CVD synthetic diamond wafer may be used in large area form or otherwise may be cut into smaller items depending on the end application.

While this invention has been particularly shown and described with reference to preferred embodiments, it will be understood to those skilled in the art that various changes in form and detail may be made without departing from the scope of the invention as defined by the appendant claims.

The invention claimed is:

1. A method of fabricating a polycrystalline CVD synthetic diamond material having an average thermal conductivity at room temperature through a thickness of the polycrystalline CVD synthetic diamond material of at least 2000 $Wm^{-1}K^{-1}$, the method comprising:
   loading a refractory metal substrate into a CVD reactor;
   locating a refractory metal guard ring around a peripheral region of the refractory metal substrate, the refractory metal guard ring defining a gap between an edge of the refractory metal substrate and the refractory metal guard ring having a width 1.5 mm to 5.0 mm;
introducing microwaves into the CVD reactor at a power such that the power density in terms of power per unit area of the refractory metal substrate is in a range 2.5 to 4.5 W mm$^{-2}$;
introducing process gas into the CVD reactor wherein the process gas within the CVD reactor comprises a nitrogen concentration in a range 600 ppb to 1500 ppb calculated as molecular nitrogen N$_2$, a carbon containing gas concentration in a range 1.5% to 3.0% by volume, and a hydrogen concentration in a range 92% to 98.5% by volume;
controlling an average temperature of the refractory metal substrate to lie in a range 750° C. to 950° C. and to maintain a temperature difference between an edge and a centre point on the refractory metal substrate of no more than 80° C.
growing polycrystalline CVD synthetic diamond material to a thickness of at least 1.3 mm on the refractory metal substrate; and
cooling the polycrystalline CVD synthetic diamond material to yield a polycrystalline CVD synthetic diamond material having a thickness of at least 1.3 mm, an average thermal conductivity at room temperature through the thickness of the polycrystalline CVD synthetic diamond material of at least 2000 Wm$^{-1}$K$^{-1}$ over at least a central area of the polycrystalline CVD synthetic diamond material, wherein the central area is at least 70% of a total area of the polycrystalline CVD synthetic diamond material, a single substitutional nitrogen concentration no more than 0.80 ppm and no less than 0.10 ppm over at least the central area of the polycrystalline CVD synthetic diamond material, and wherein the polycrystalline CVD synthetic diamond material is substantially crack free over at least the central area thereof such that the central area has no cracks which intersect both external major faces of the polycrystalline CVD synthetic diamond material and extend greater than 2 mm in length.

2. A method according to claim 1, wherein the refractory metal substrate has a diameter which lies in a range 60 mm to 120 mm, 80 mm to 110 mm, 90 mm to 110 mm, or 95 mm to 105 mm.

3. A method according to claim 1, wherein the gap between the edge of the refractory metal substrate and the refractory metal guard ring has a width in a range 2.0 mm to 4.0 mm, or 2.5 mm to 3.5 mm.

4. A method according to claim 1, wherein the nitrogen concentration in the process gas within the CVD reactor, calculated as molecular nitrogen N$_2$, lies in a range 700 ppb to 1300 ppb, 800 ppb to 1200 ppb, or 900 ppb to 1100 ppb.

5. A method according to claim 1, wherein the carbon containing gas concentration of the process gas within the CVD reactor lies in a range 1.6% to 2.5%, 1.7% to 2.3%, or 1.8 to 2.1% by volume.

6. A method according to claim 1, wherein the hydrogen concentration of the process gas within the CVD reactor lies in a range 94% to 97%, or 95% to 96% by volume.

7. A method according to claim 1, wherein the average temperature of the refractory metal substrate is controlled to lie in a range 775° C. to 900° C., 800° C. to 875° C., or 820° C. to 860° C.

8. A method according to claim 1, wherein the temperature difference between the edge and the centre point on the refractory metal substrate is no more than 60° C., 40° C., 20° C., or 10° C.

9. A method according to claim 1, wherein the power density is in a range 2.75 to 4.25 W mm$^{-2}$, 3.0 to 4.0 W mm$^{-2}$, 3.2 to 3.8 W mm$^{-2}$, or 3.3 to 3.6 W mm$^{-2}$.

10. A method according to claim 1, wherein an operating pressure during growth of the polycrystalline CVD synthetic diamond material is controlled within a range 100 to 300 torr, 150 to 250 torr, 175 to 225 Torr, or 195 to 205 Torr.

11. A polycrystalline CVD synthetic diamond material comprising:
an average thermal conductivity at room temperature through a thickness of the polycrystalline CVD synthetic diamond material of at least 2000 Wm$^{-1}$K$^{-1}$ over at least a central area of the polycrystalline CVD synthetic diamond material, wherein the central area is at least 70% of a total area of the polycrystalline CVD synthetic diamond material; and
a single substitutional nitrogen concentration no more than 0.80 ppm and no less than 0.10 ppm over at least the central area of the polycrystalline CVD synthetic diamond material;
wherein the thickness of the polycrystalline CVD synthetic diamond material is at least 1.3 mm; and
wherein the polycrystalline CVD synthetic diamond material is substantially crack free over at least the central area such that the central area has no cracks which intersect both external major faces of the polycrystalline CVD synthetic diamond material and extend greater than 2 mm in length.

12. A polycrystalline CVD synthetic diamond material according to claim 11, wherein the average thermal conductivity at room temperature through the thickness of the polycrystalline CVD synthetic diamond material is at least 2025 Wm$^{-1}$K$^{-1}$, 2050 Wm$^{-1}$K$^{-1}$, 2075 Wm$^{-1}$K$^{-1}$, 2100 Wm$^{-1}$K$^{-1}$, 2125 Wm$^{-1}$K$^{-1}$, or 2150 Wm$^{-1}$K$^{-1}$.

13. A polycrystalline CVD synthetic diamond material according to claim 11, wherein the average thermal conductivity at room temperature through the thickness of the polycrystalline CVD synthetic diamond material is less than 2200 Wm$^{-1}$K$^{-}$, 2180 Wm$^{-1}$K$^{-1}$ 2175 Wm$^{-1}$K$^{-1}$, or 2160 Wm$^{-1}$K$^{-1}$.

14. A polycrystalline CVD synthetic diamond material according to claim 11, wherein the polycrystalline CVD synthetic diamond material has an as-grown diameter in the range 60 mm to 120 mm, 80 mm to 110 mm, 90 mm to 110 mm, or 95 mm to 105 mm.

15. A polycrystalline CVD synthetic diamond material according to claim 11, wherein the thickness is at least 1.5 mm, 1.7 mm, 1.8 mm, 1.9 mm, 2.0 mm, 2.2 mm, 2.5 mm, 2.75 mm, 3.0 mm, 3.25 mm, or 3.5 mm.

16. A polycrystalline CVD synthetic diamond material according to claim 11, wherein the single substitutional nitrogen concentration is no more than 0.70 ppm, 0.60 ppm, 0.50 ppm, or 0.45 ppm.

17. A polycrystalline CVD synthetic diamond material according to claim 11, wherein the single substitutional nitrogen concentration is no less than 0.20 ppm, 0.30 ppm, or 0.35 ppm.

18. A polycrystalline CVD synthetic diamond material according to claim 11, wherein the diameter of the central area is at least 75%, 80%, 85%, 90%, 95%, or 99% of the as-grown diameter of the polycrystalline CVD synthetic diamond material.

* * * * *